(12) United States Patent
Hosek

(10) Patent No.: US 8,892,248 B2
(45) Date of Patent: Nov. 18, 2014

(54) MANIPULATOR AUTO-TEACH AND POSITION CORRECTION SYSTEM

(71) Applicant: Brooks Automation, Inc., Chelmsford, MA (US)

(72) Inventor: Martin Hosek, Lowell, MA (US)

(73) Assignee: Brooks Automation, Inc, Chelmsford, MA (US)

( * ) Notice: Subject to any disclaimer, the term of this patent is extended or adjusted under 35 U.S.C. 154(b) by 0 days.

(21) Appl. No.: 13/914,397

(22) Filed: Jun. 10, 2013

(65) Prior Publication Data

US 2013/0345858 A1 Dec. 26, 2013

Related U.S. Application Data

(63) Continuation of application No. 12/651,160, filed on Dec. 31, 2009, now Pat. No. 8,459,922.

(60) Provisional application No. 61/281,188, filed on Nov. 13, 2009.

(51) Int. Cl.
*G06F 7/00* (2006.01)
*H01L 21/68* (2006.01)
*H01L 21/67* (2006.01)
*G05B 19/421* (2006.01)
*G05B 19/402* (2006.01)
*G05B 19/418* (2006.01)

(52) U.S. Cl.
CPC ............ *G05B 19/4189* (2013.01); *H01L 21/68* (2013.01); *H01L 21/67294* (2013.01); *G05B 2219/36461* (2013.01); *G05B 19/421* (2013.01); *G05B 19/402* (2013.01); *G05B 2219/36414* (2013.01); *Y10S 901/00* (2013.01)
USPC ......... 700/230; 700/245; 700/59; 318/568.16

(58) Field of Classification Search
USPC ........................................................ 700/230
See application file for complete search history.

(56) References Cited

U.S. PATENT DOCUMENTS 3,376,578 A 4/1968 Sawyer
5,483,138 A * 1/1996 Shmookler et al. ...... 318/568.16
(Continued)

FOREIGN PATENT DOCUMENTS

WO 96/09918 4/1996

OTHER PUBLICATIONS

International Search Report mailed Mar. 17, 2011, International application No. PCT/US2010/061407, International filed Dec. 21, 2010.

(Continued)

*Primary Examiner* — Gene Crawford
*Assistant Examiner* — Kyle Logan
(74) *Attorney, Agent, or Firm* — Perman & Green, LLP; Colin C. Durham

(57) ABSTRACT

A substrate processing system including a housing for housing at least part of a processing device, at least one target affixed to the processing device, the processing device having a first processing device reference point in a known relationship with the at least one target, at least one transmitter located within the housing and configured to transmit an identification signal identifying the at least one transmitter to the at least one target and a controller operably connected to the at least one target and the at least one transmitter, the controller being configured to receive data signals, based on the identification signal, from one of the at least one target and the at least one transmitter and control an operational characteristic of the processing device, based on the data signals.

20 Claims, 15 Drawing Sheets

(56) References Cited

U.S. PATENT DOCUMENTS

| | | | |
|---|---|---|---|
| 5,740,062 A * | 4/1998 | Berken et al. | 700/218 |
| 5,980,194 A * | 11/1999 | Freerks et al. | 414/754 |
| 6,075,334 A | 6/2000 | Sagues et al. | |
| 6,198,976 B1 * | 3/2001 | Sundar et al. | 700/59 |
| 6,242,879 B1 | 6/2001 | Sagues et al. | |
| 6,275,748 B1 | 8/2001 | Bacchi et al. | |
| 6,304,051 B1 | 10/2001 | Sagues et al. | |
| 6,323,616 B1 | 11/2001 | Sagues et al. | |
| 6,327,517 B1 * | 12/2001 | Sundar | 700/245 |
| 6,360,144 B1 | 3/2002 | Bacchi et al. | |
| 6,366,830 B2 | 4/2002 | Bacchi et al. | |
| 6,452,668 B1 | 9/2002 | Pratt | |
| 6,533,521 B1 | 3/2003 | Todorov et al. | |
| 6,591,160 B2 | 7/2003 | Hine et al. | |
| 7,165,927 B2 | 1/2007 | Doherty et al. | |
| 7,233,841 B2 | 6/2007 | Sadighi et al. | |
| 7,248,931 B2 * | 7/2007 | Raaijmakers | 700/57 |
| 7,419,346 B2 | 9/2008 | Danna et al. | |
| 7,458,763 B2 | 12/2008 | van der Meulen | |
| 7,627,395 B2 | 12/2009 | Sadighi et al. | |
| 7,959,403 B2 | 6/2011 | van der Meulen | |
| 7,988,399 B2 | 8/2011 | van der Meulen | |
| 8,099,190 B2 * | 1/2012 | De Ridder et al. | 700/245 |
| 2004/0078114 A1 | 4/2004 | Cordell et al. | |
| 2004/0151562 A1 | 8/2004 | Hofmeister et al. | |
| 2004/0258514 A1 * | 12/2004 | Raaijmakers | 414/935 |
| 2005/0105991 A1 * | 5/2005 | Hofmeister et al. | 414/217 |
| 2009/0087288 A1 | 4/2009 | Hofmeister et al. | |
| 2009/0259337 A1 | 10/2009 | Harrold et al. | |
| 2010/0145513 A1 * | 6/2010 | Yim et al. | 700/245 |

OTHER PUBLICATIONS

Butler, Z. et al., "Integrated precision 3-DOF position sensor for planar linear motors," Proceedings of 1998 IEEE International Conference on Robotics and Automatin, Leuven, Belgium, May 1998, pp. 1-6.

Fries, G. et al., "Fluorescent dye based optical position sensing for planar linear motors," Proceedings of 1999 IEEE International Conference on Robotics and Automation, Detroit, Michigan, May 1999, pp. 1-6.

Sharke, P. et al., "Measuring across space and time," Mechanical Engineering Magazine, 223(B3): p. 217-229 Jan. 2003.

Constellation—Indoor GPS for Metrology, White Paper 071502, Arc Second Inc., Dulles, VA, 2002.

Constellation—Error Budget and Specifications, White Paper 063102, Arc Second Inc., Dulles, VA 2002.

* cited by examiner

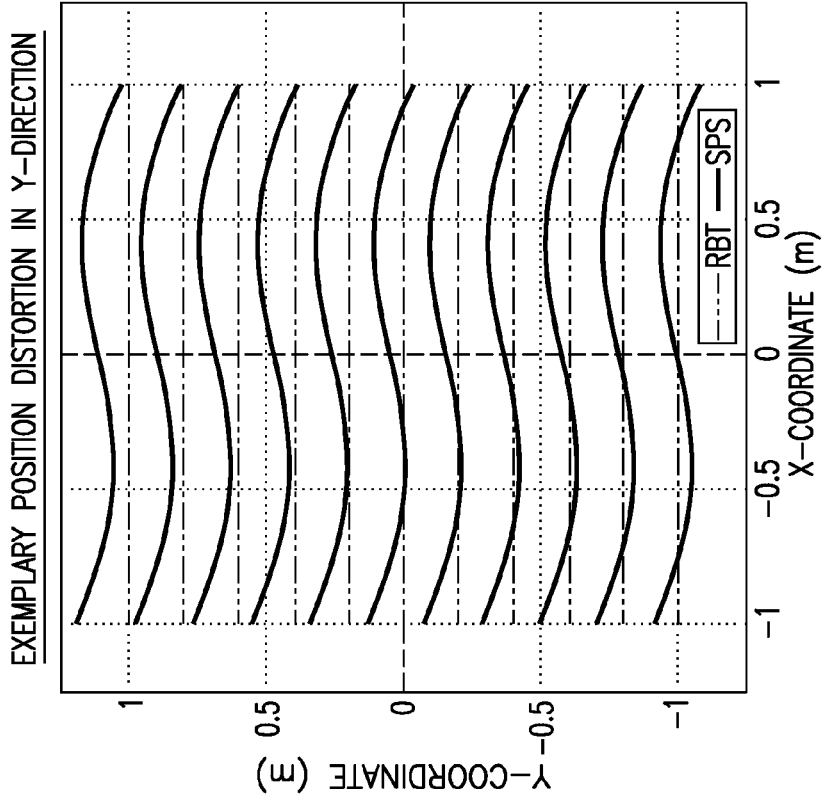
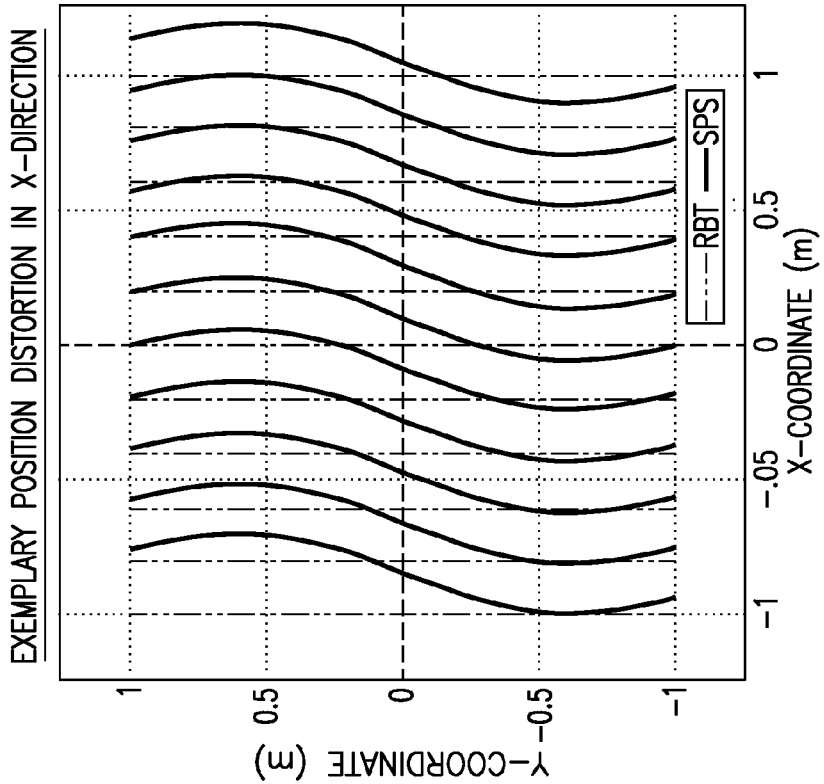

MANIPULATOR AUTO-TEACH AND POSITION CORRECTION SYSTEM

CROSS REFERENCE TO RELATED APPLICATIONS

This application is a continuation of U.S. patent application Ser. No. 12/651,160, filed Dec. 31, 2009, which claims the benefit of U.S. Provisional Patent Application No. 61/281,188, filed on Nov. 13, 2009, the disclosures of which are incorporated by reference herein in its entirety.

BACKGROUND

1. Field

The exemplary embodiments generally relate to robotic systems and, more particularly, to the setup and operation of robotic systems.

2. Brief Description of Related Developments

Generally setting up a robotic manipulator is a time consuming and tedious process that is performed manually or automatically. Manual setup of the robotic manipulators tends to be subjective with respect to the operator performing the setup and is generally unrepeatable. The subjective and unrepeatable nature of manual set up generally affects the resulting performance of the system in which the manipulator is installed. The time to complete the manual set up (e.g. labor cost, tool time, etc.) may also make setting up the manipulators expensive. Manual set up of the robotic manipulators may also cause contamination of the system where the system is particle sensitive (e.g. a clean room environment) and involve human and equipment safety hazards (e.g. exposure to harmful chemicals or risk of damaging the robotic manipulator and other parts of the system through collision).

Conventionally automatic set up of robotic manipulators involves the use of expensive fixtures and various sensors mounted on the robotic manipulator and/or processing equipment that the manipulator interacts with. The sensors are generally magnetic, optical or tactile sensors that allow a robot controller to sense a particular feature of an alignment fixture or an increase in motor torque that would indicate the manipulator has contacted the fixture or station.

It would be advantageous to be able to automatically teach points within a robotic system without a robotic manipulator of the system interacting with a station (e.g. substrate holding station or otherwise) of the system. It would also be advantageous if an automatic teaching system can provide benefits beyond automatic station teaching, as described below.

BRIEF DESCRIPTION OF THE DRAWINGS

The foregoing aspects and other features of the disclosed embodiments are explained in the following description, taken in connection with the accompanying drawings, wherein:

FIGS. 4A-4B illustrate exemplary graphs of position distortion in accordance with an exemplary embodiment;

DETAILED DESCRIPTION OF THE EXEMPLARY EMBODIMENT(S)

Figure 1A:
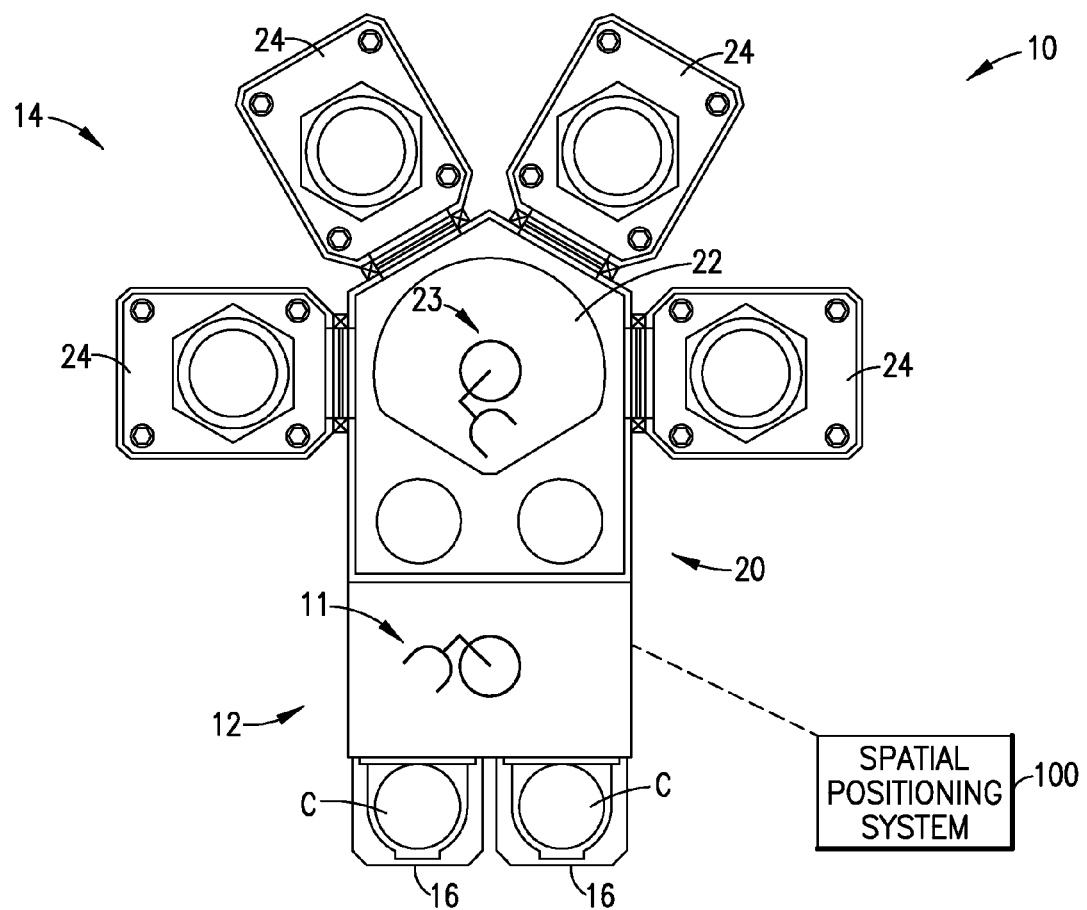
FIGS. 1A-1C illustrate exemplary processing systems in accordance with an exemplary embodiment.
Figure 1B:
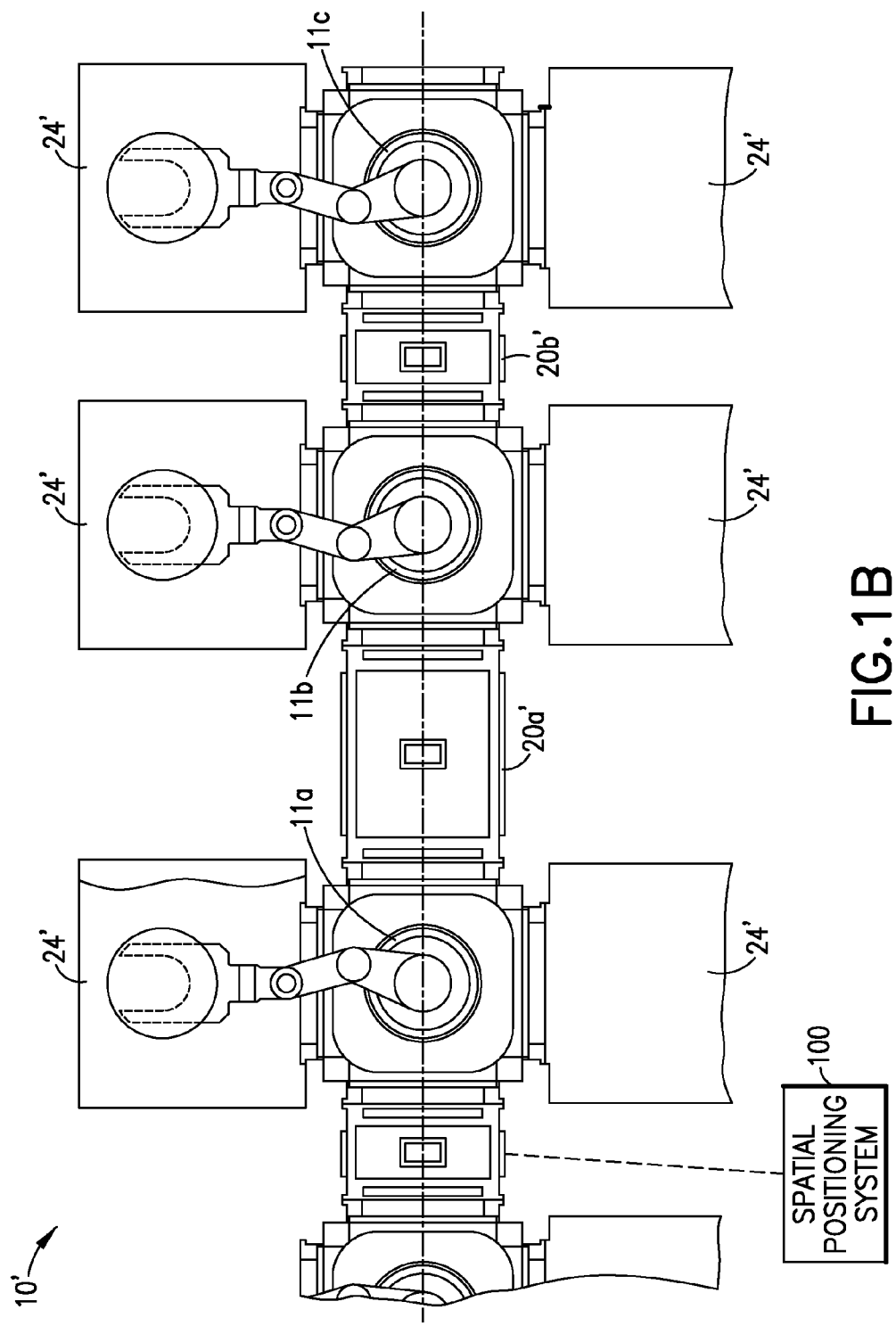
Figure 1C:
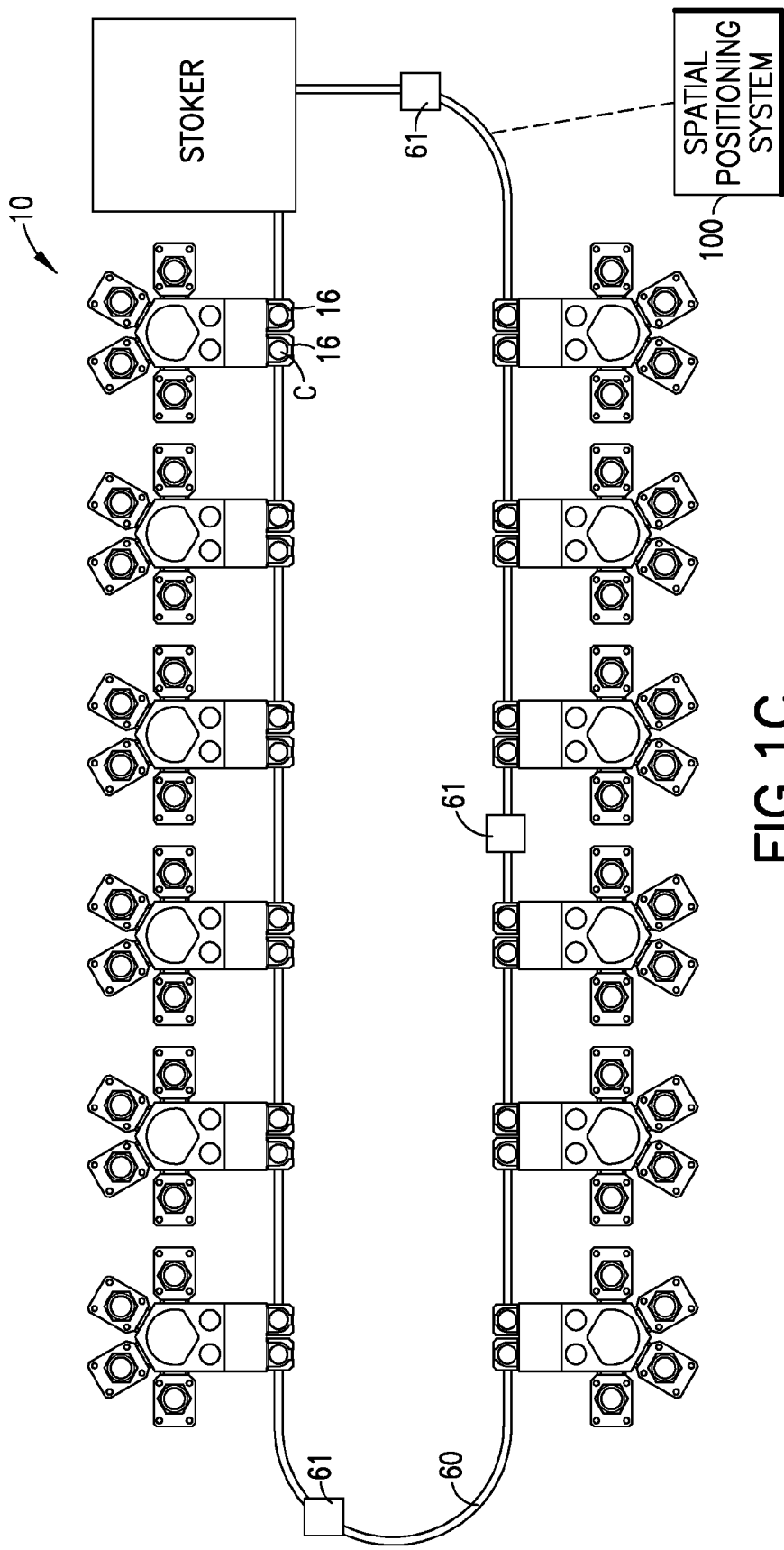

FIGS. 1A-1C illustrate exemplary processing environments in accordance with an exemplary embodiment. Although the disclosed embodiments will be described with reference to the embodiments shown in the drawings, it should be understood that the disclosed embodiments can be embodied in many alternate forms. In addition, any suitable size, shape or type of elements or materials could be used.

In one aspect of the exemplary embodiments, a spatial positioning system (SPS) 100 may be configured to automatically teach robotic manipulators locations in, for example, pick and place applications, as will be described below in a non-contact manner (e.g. without jigs or fixtures or contact with a work station). The exemplary embodiments may be configured to substantially eliminate manually teaching a robotic manipulator positions within a workspace. The automatic teaching of the exemplary embodiments may provide repeatable setup of the robotic manipulator in an efficient manner and in a short time period. The auto-teaching may be performed without introducing contaminates into a clean room environment (e.g. laboratory, operating room, semiconductor manufacturing tool/facility) because of minimized human interaction with the spatial positioning system 100.

In another aspect of the exemplary embodiments the spatial positioning system 100 may be configured to align and/or level individual stations in a system with respect to a common reference point as will be described below. For exemplary purposes only, the stations may be any suitable stations including substrate aligners, loadports and process modules of semiconductor substrate handling tools. The alignment and/or leveling of the stations may be made at any suitable time such as, for example, during system integration (e.g. during manufacture of the system) or in the field when the system is serviced (e.g. during maintenance procedures, etc.). For exemplary purposes only, one example of when a station is set up includes during the manufacture of the processing equipment (this may include an initial set up of, for example, the material handling platform at an automation supplier, after which the set up may be partially disassembled and sent to the material processing system manufacturer. The processing system may be integrated into a larger system at a material processing system manufacturer, after which the system may be partially disassembled and sent to an end user). Another example, of when a station is set up includes during system integration at, for example, the end user (e.g. a semiconductor manufacturing facility or other suitable facility). Yet another example of when a station is set up includes maintenance or service of the system at, for example, the end user's facility (e.g. such as when a component, such as a robotic manipulator or process module, is serviced or replaced). The disclosed embodiments may provide any suitable spatial information such as, for example, information regarding station leveling, including but not limited to, the amount of adjustments for correcting station-leveling errors using existing station adjustment features.

In yet another aspect, the exemplary embodiments may be configured to correct positional errors of the robotic manipulator while the manipulator is in use (e.g. on-the-fly) as will be described below. Such positional errors may result from, for example, inaccuracy of position feedback devices used to track the position of the robotic manipulator. The positional errors may also be introduced through tolerances in mechanical components of the robotic manipulator, which may be amplified by non-linear mechanisms of the manipulator or wear on the mechanical parts of the manipulator. The exemplary embodiments may increase the accuracy and repeatability of pick and place operations as well as relax accuracy requirements of position feedback devices and manufacturing tolerances with respect to mechanical components of the robotic manipulators.

In another aspect of the disclosed embodiments, the spatial positioning system 100 may be configured to provide substantially simultaneous non-contact measurement of all coordinates for controlling and/or commutating motors as will be described below. As a non-limiting example, the spatial positioning system may be configured to measure the axial and/or rotational coordinates of any suitable motor including, but not limited to, planar or linear motors, spherical motors and self bearing motors (e.g. self bearing rotational motors, magnetically levitated platforms, etc.). Examples of suitable motors include those described in U.S. application Ser. No. 11/769,651, filed on Jun. 27, 2007, the disclosure of which is incorporated by reference herein in its entirety.

Referring now to FIG. 1A, the exemplary embodiments may be part of a semiconductor processing apparatus or system. It is noted that while the exemplary embodiments will be described with respect to semiconductor manufacturing apparatus, it should be realized that the exemplary embodiments are equally applicable to any pick and place environments and/or robotic systems including, but not limited to, assembly plants, medical devices (e.g. robotic surgery apparatus, etc.) and laboratory equipment to provide, for example, accurate positioning relative to stationary or moving objects.

Figure 2:
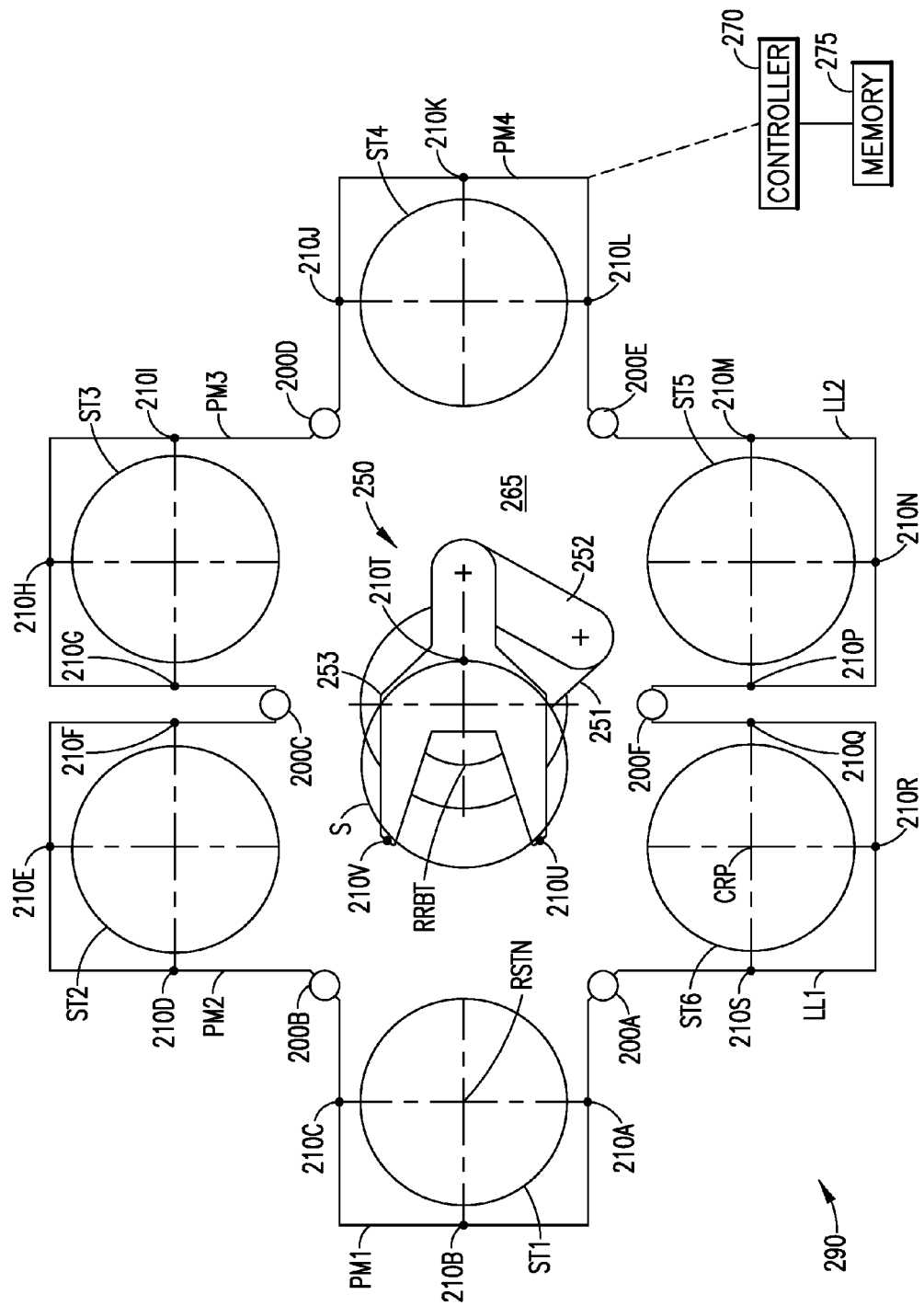
FIG. 2 illustrates a positioning system in accordance with an exemplary embodiment.

The processing apparatus 10 in the exemplary embodiment is shown in FIG. 1A as a cluster tool, which has a representative configuration. In alternate embodiments the processing apparatus 10 may have any other desired configuration. The apparatus 10 may be sized and shaped to allow, for example, processing of semiconductor substrates or wafers, such as 200 mm, 300 mm, 350 mm, 400 mm or even larger diameter wafers. In alternate embodiments, the processing apparatus may be capable of processing any other desired substrate including, but not limited to, substrates for flat panel displays. In the exemplary embodiment shown in FIG. 1A, the apparatus 10 may generally have a front section 12 and a rear section 14. The front section 12 may be arranged to provide an interface to apparatus 10 with the rest of the fabrication facility (FAB). For example the front section 12 may be an environmentally controlled module with one or more load ports 16 (two are shown for example purposes) allowing docking of any suitable substrate carriers such as SMIFs and FOUPs. The loadports may be situated to allow loading/unloading of carriers C automatically, such as via an interface with FAB automated material handling systems or vehicles, or via manual means. The front section 12 may have any suitable transport apparatus 11 for loading/unloading substrates between apparatus 10 and the carriers C docked at the apparatus interface. Suitable transport apparatus include, but are not limited to, the exemplary transport described in commonly owned U.S. Pat. No. 6,002,840 the disclosure of which is incorporated herein by reference in its entirety. In one example, the transport apparatus may be a SCARA type transport apparatus 250 as can be seen in FIG. 2 that includes an upper arm 251, a forearm 252 and an end effector 253. A suitable example of a tool front section, similar to front section 12, is described in U.S. patent application Ser. No. 11/178,836, filed on Jul. 11, 2005, which is incorporated by reference herein in its entirety. In alternate embodiments, the apparatus front section may have any other desired configuration. In other alternate embodiments, the apparatus may not have a segregated or otherwise discernible front end section in that the rear section may communicate directly with the apparatus loading interface without intervening load locks.

The rear section 14 may be capable of holding an isolated atmosphere, isolated both from outside atmosphere, and in the exemplary embodiment capable of being isolated from the atmosphere of the front section. The rear section 14 may hold an inert gas (such as nitrogen or argon) or the rear section 14 may hold a vacuum. In the exemplary embodiment, the rear section generally has a load lock section 20, a transport chamber 22 and processing modules 24. One or more of the load lock section 20, transport chamber 22 and processing modules 24 may include one or more slot valves that serve to isolate the rear section 14 and/or one or more of the load lock 20, transport chamber 22 and processing section 24. The slot valves may be any suitable slot valves having any suitable configuration. The rear section 14 may also have any suitable substrate transport system 23 located in the transport chamber 22 for transporting substrates between the load lock and processing section of the apparatus. As may be realized, the load lock section 20, interfacing the rear section with the front, allows transport of substrates between the atmospherically isolated rear section 14 and front section 12 without compromise of the isolated atmosphere in the rear section 14. The processing modules 24 may be arranged to perform any desired processing of the substrates (e.g. material deposition, ion implantation, cleaning, etching, polishing, metrology, etc.). As will be described in greater detail below, the processing apparatus 10 may be configured with the spatial positioning system 100.

Referring now to FIG. 1B, another exemplary processing apparatus 10' is shown. In this example, the processing apparatus 10' is a linearly distributed processing system that includes processing modules 24', substrate transports 11a-11c and load locks 20a', 20b'. An exemplary linearly distributed processing apparatus can be found in U.S. patent application Ser. No. 11/442,511, filed on May 26, 2006, the disclosure of which is incorporated by reference herein in its entirety. The linearly distributed processing apparatus may be configured with the spatial positioning system 100 described in greater detail below.

Referring to FIG. 1C, the spatial positioning system 100 may be configured to align components within any portion(s) of a fabrication facility. For example, the spatial positioning system 100 may be configured to automatically align overhead transport vehicles 61 of an automated material handling system 60 with the loadports 16 of the processing apparatus 10. An example of a suitable overhead transport system is described in U.S. Pat. No. 7,165,927, the disclosure of which is incorporated by reference herein in its entirety. It should be realized that the spatial positioning system 100 can be configured to align any suitable automated material handling system, including but not limited to, the overhead transports and ground based transports such as conveyors and/or carts such as those described in U.S. patent application Ser. No. 10/624,987, filed on Jul. 22, 2003, the disclosure of which is incorporated by reference herein in its entirety.

Referring again to FIG. 2, the spatial positioning system will now be described in greater detail with respect to processing apparatus 290. In this example the processing apparatus 290 may be substantially similar to the back end 14 and load lock described above with respect to FIG. 1A. For example, processing modules PM1-PM4 may be substantially similar to processing modules 24 while load locks LL1, LL2 may be substantially similar to load locks 20 described above with respect to FIG. 1A. The spatial positioning system 100 may include a controller 270, one or more transmitters 200A-200F and one or more targets 210A-210N, 210P-210V. As will be described below, the targets may be passive for passively returning signals from the transmitters to a receiving element or the targets may be active receivers for receiving the signals from the transmitters. It is noted that while a certain number of transmitters and targets are shown in the Figures, in alternate embodiments there may be any suitable number of transmitters and targets such as more or less than that shown in the Figures. The controller 270 may be any suitable controller including processors, memory (e.g. memory 275) and computer readable program code stored on the memory for carrying out aspects of the exemplary embodiments described herein. The controller 270 may be dedicated to the spatial positioning system 100 or it may be part of a control system for operation of the processing apparatus 290 and/or fabrication facility.

In one exemplary embodiment, the transmitters 200A-200F may be any suitable transmitters including, but not limited to, optical, radio frequency, cellular and auditory transmitters. Each of the transmitters 200A-200F may be connected to the controller 270 in any suitable manner including, but not limited to, wired or wireless connections. The transmitter may transmit any suitable signal having any suitable characteristics that can effect detection of the targets 210A-210N, 210P-210V and interpreted by the controller 270 for making a position determination as will be described below. In one exemplary embodiment, the transmitters may include receivers for detecting, for example, signals passively reflected back (or otherwise returned) to the transmitters by the targets. In alternate embodiments the targets may include receivers located in any suitable position for receiving the signals from the transmitters. The signals transmitted by each transmitter 200A-200F may be configured so that, for example, a controller 270 can identify each transmitter 200A-200F by its respective signal. In alternate embodiments each transmitter 200A-200F may be identified in any suitable manner. In alternate embodiments, it is noted that the positions of the targets and transmitter can be reversed as long as it is possible to obtain equivalent positional information for determining a position of an object as described herein.

The targets 210A-210N, 210P-210V may be any suitable targets capable of being detected by the transmitters 200A-200F so their position may be determined. In this exemplary embodiment, the targets 210A-210N, 210P-210V may be passive targets that may passively reflect (or otherwise send back) a signal sent from the transmitter back to the transmitter from which the signal came for detection, by for example, any suitable receiver. The targets 210A-210N, 210P-210V may not be connected to or share information with any other device, such as controller 270, while still allowing for their detection by, for example, the transmitter (or other receiving device). In alternate embodiments the targets may be active targets that may, for example, process the signals from the transmitters for transmitting those signals to another component of the system such as, for example, to the controller 270. In other alternate embodiments, where the targets 210A-210N, 210P-210V are active the targets may be suitably connected to, for example, the controller 270 in any suitable manner such as described above with respect to the transmitters 200A-200F.

In other exemplary embodiments, the spatial positioning system 100 may include reference transceivers (that may replace the transmitters 200A-200F) and active transceivers (that may replace the targets 210A-210F, 210P-210V) or vice versa. The reference transceivers may emit a signal as described above which is received by the active transceivers. The active transceivers may transmit the same or a different signal back to the reference transceivers. The reference transceivers are configured to read the signal from the active transceivers and communicate the same to the controller 270 to carry out the determinations/calculations described herein.

The transmitters 200A-200F may be placed at any suitable locations around and/or within the processing apparatus 290. For exemplary purposes only, in FIG. 2 the transmitters 200A-200F are located such that one transmitter is located on each side of the interface between the transport chamber 265 and each of the processing modules PM1-PM4 and load locks LL1, LL2. The targets 210A-210N, 210P-210V may be located at any suitable position(s)/location(s) in and/or around the components of the processing apparatus 290. It is noted that in one exemplary embodiment, the locations of the targets 210A-210N, 210P-210V may be selected so that each target can interact with a sufficient number of transmitters 200A-200F for determining the location of the target 210A-210N, 210P-210V. For example, the targets may be located within a predetermined range of a given transmitter so that the transmitter has a substantially unobstructed "view" of the target. The components may include, but are not limited to, any suitable components of the processing apparatus that interact with each other such as, for example, the processing modules PM1-PM4, the load locks LL1, LL2 and the transport apparatus 250. In this example each of the processing modules PM1-PM4 and load locks LL1, LL2 includes three targets. In alternate embodiments each of the processing modules PM1-PM4 and load locks LL1, LL2 may have more or less than three targets. As can also be seen in FIG. 2, the transport apparatus 250 is shown as including three targets 210T-210V but in alternate embodiments the transport apparatus may have more or less than three targets. In this example, the targets 210T-210V are located on the end effector 253 but in alternate embodiments the targets 210T-210V may be located at any suitable location on the transport apparatus 250. In this example, it is noted that three targets are used at each processing module PM1-PM4, each load lock LL1, LL2 and the transport apparatus 250 as three points generally define the position of an object in a given space envelope (e.g. three coordinates x, y, z and three rotations Rx, Ry, Rz of a reference point can be determined from the locations of the three points to uniquely identify the position of the object to which the targets are attached in the space envelope).

In alternate embodiments the targets 210A-210S may be incorporated into a fixture that can be placed or affixed to one or more stations for the automatic teaching or position correction of the transport apparatus 250. In other alternate embodiments, the targets 210T-210V may be incorporated into a fixture that is carried by the transport apparatus 250 to affect the automatic teaching of the transport apparatus 250.

Still referring to FIG. 2, a reference point (or points) is assigned to each of the components of the processing apparatus. For example, a station reference point RSTN may be assigned to processing module PM1. In one example, the reference point RSTN may correspond to a predetermined substrate location (e.g. a center of the substrate at the predetermined location) within the processing module. In alternate embodiments the reference point RSTN may correspond to any suitable point within the processing module PM1. The location of the station reference point RSTN may coincide with or be known with respect to one or more of the targets such as targets 210A-210C located in the processing module PM1. As may be realized, reference points may also be assigned to the other processing modules PM2-PM4 in a manner substantially similar to that described above.

A manipulator reference point RRBT may also be associated with the transport apparatus 250. In this example the manipulator reference point RRBT is located on the end effector 253 such that its location coincides with a predetermined centered location of a substrate S when the substrate is carried on the end effector 253. In alternate embodiments the reference point RRBT may be at any suitable location on the transport apparatus 250. As described above with respect to the station reference point RSTN the location of the manipulator reference point RRBT may coincide with or be known with respect to one or more of the targets such as targets 210T-210V located on the end effector 253. The transport apparatus 250 may also include suitable position feedback devices such as, for example, encoders that may be used in conjunction with kinematic equations of the transport 250 to determine the position of the manipulator reference point RRBT.

The station and manipulator reference points RSTN and RRBT, respectively, may represent locations in space defined by, for example, three independent coordinates, such as x, y, z, or may be generalized to embody reference coordinate systems defined by, for example, six independent coordinates, such as x, y, z, Rx, Ry, R, where Rx, Ry, R, respectively denote rotation with respect to the x, y and z axes. In alternate embodiments, the reference points RSTN and RRBT may represent any suitable point in any suitable coordinate system having any suitable number of axes. For explanatory purposes only, the coordinate system associated with the spatial positioning system 100 is referred to herein as the global coordinate system while the coordinate system utilizing the transport apparatus position feedback devices is referred to herein as the robot coordinate system. As will be described below the spatial positioning system 100 is configured to provide substantially simultaneous teaching of all the degrees of freedom of the transport apparatus 250 in a uniquely short time period. It is noted that the transport apparatus 250 of FIG. 2 (used to describe the exemplary embodiments) includes six degrees of freedom corresponding to the six independent coordinates described above, but in alternate embodiments the transport apparatus may have more or less than six degrees of freedom.

Figure 3A:
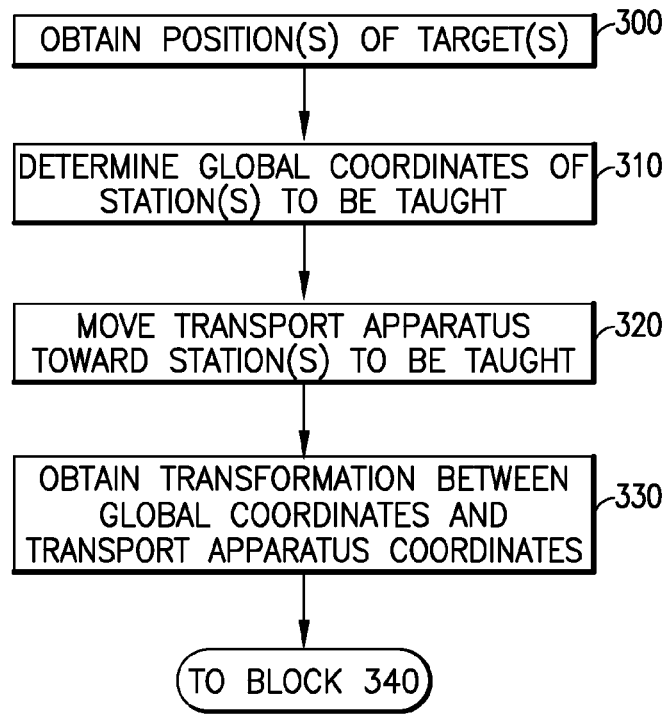
FIGS. 3A-3B illustrate a flow diagram in accordance with an aspect of an exemplary embodiment.
Figure 3B:
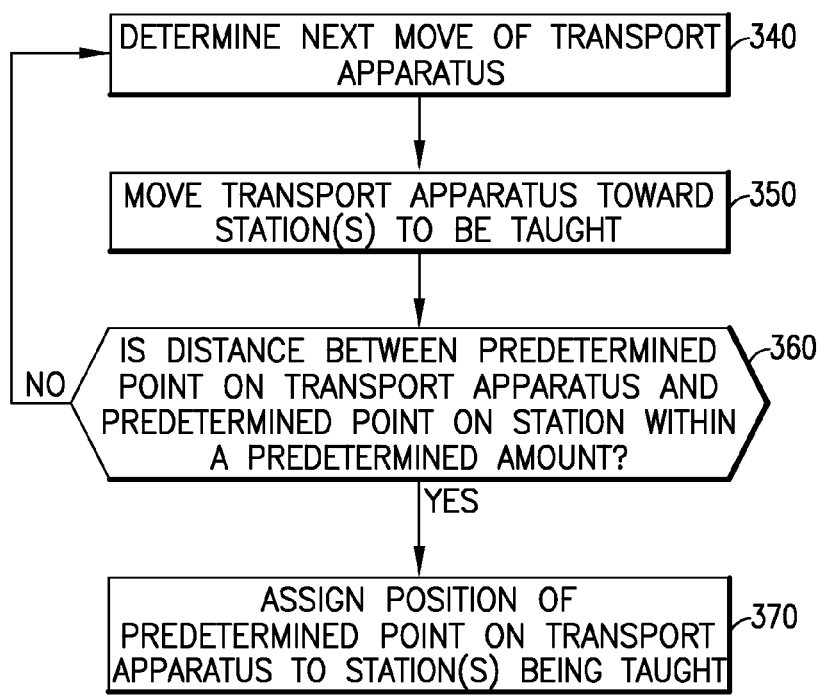

Referring also to FIGS. 3A-3B the automatic teaching of processing module PM1 and station ST1 will be described for illustrative purposes only. It should be realized that a location of any suitable component of the processing apparatus 290 (or any component in a fabrication facility) may be taught in a substantially similar manner. The location(s) of the targets 210A-210C incorporated into the processing module PM1 are obtained in any suitable manner from the spatial positioning system 100 (Block 300, FIG. 3A). For example, the signals transmitted by the transmitters 200A, 200B may be oriented or timed in any suitable manner such that, for example, a first signal from transmitter 200A and a second signal from transmitter 200B are received by a receiver (e.g. after being, for example, reflected by a respective one of the targets 210A-210C) at a respective first and second time. In alternate embodiments, the signals transmitted by the transmitters 200A, 200B may be oriented or timed in any suitable manner such that, for example, a first signal from transmitter 200A and a second signal from transmitter 200B are received by a respective one of the targets 210A-210C at a respective first and second time. The controller 270 may be configured to determine, for example, based on the times the first and second signals are received where in relation to the transmitters 200A, 200B each target 210A-210C is located. Each of the transmitters 200A, 200B may be at a predetermined location in the global coordinate system so that the controller 270 may determine the location of each of the targets 210A-210C in the global coordinate system based on the target's location relative to the transmitters (Block 310; FIG. 3A). In alternate embodiments, the location of the targets 210A-210C in the global coordinate system may be determined in any suitable manner.

Figure 5:
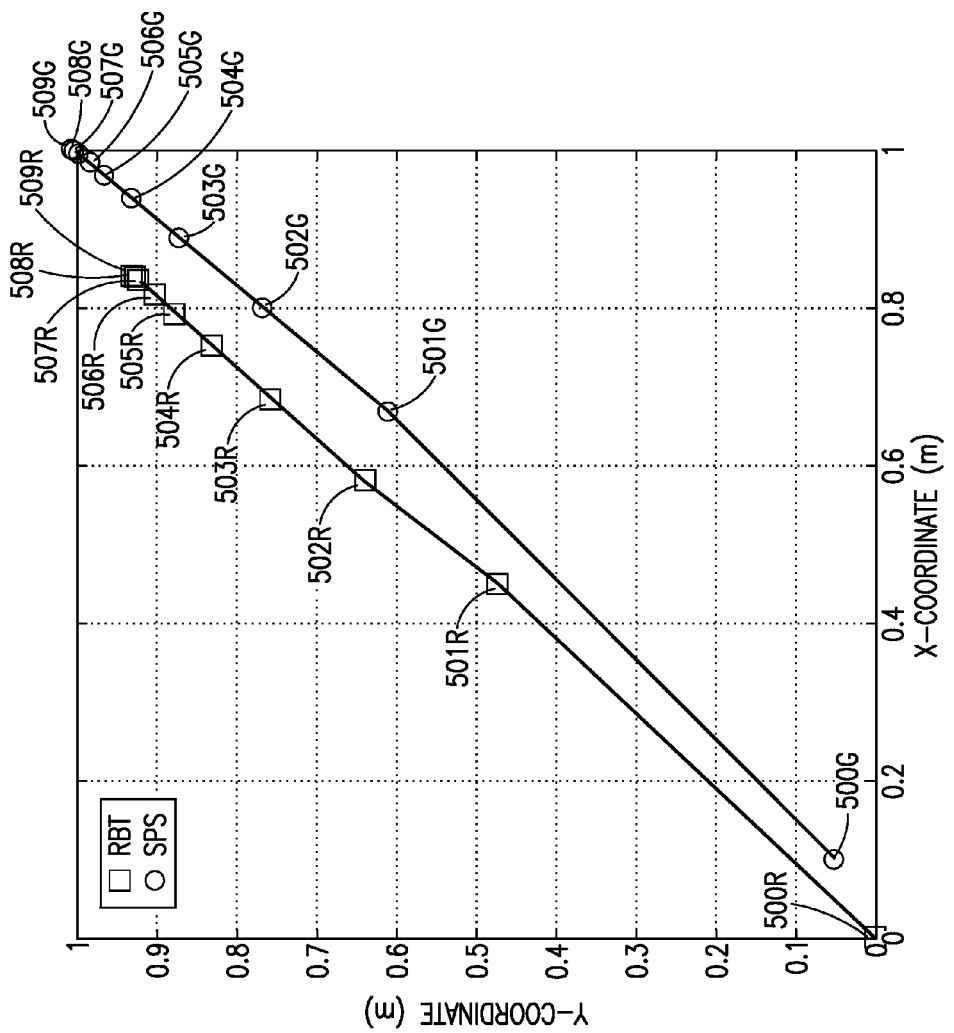
FIG. 5 shows a graph illustrating incremental moves of a manipulator in accordance with an exemplary embodiment.

Referring also to FIG. 5, the controller may command the transport apparatus 250 to perform, for example, an incremental move from its initial position 500R, 500G (where R represents robot coordinates and G represents global coordinates) toward the station that is being taught using the theoretical coordinates of the station in the robot coordinate system (Block 320, FIG. 3A). In one exemplary embodiment, the initial or retracted position of the transport apparatus 250 may be selected as the theoretical location of the station approach point. In alternate embodiments, any suitable point may be selected as the station approach point. The initial point 500R, 500G and end point 501R, 501G of the incremental move may be recorded in memory 275 by the controller 270 in both the global and robot coordinate systems. The locations of the initial point 500R, 500G and end point 501R, 501G of the incremental move in the global and robot coordinate systems may be used to quantify a transformation or relationship between the two coordinate systems (e.g. through the direction and distance measured) in, for example, the vicinity of the current position of the transport apparatus 250 (Block 330, FIG. 3A). In alternate embodiments the relationship between the global and robot coordinate systems may be determined in any suitable manner.

The transformation obtained in Block 330 and the location of the station reference point in the global coordinate system may be used to determine the direction and distance of the next incremental move (e.g. from point 501R, 501G to 502R, 502G) of the transport apparatus 250 in the robot coordinate system (Block 340, FIG. 3B). The controller 270 may command the transport apparatus 250 to perform another incremental move toward the station that is being taught using the direction and distance determined in Block 340 (Block 350, FIG. 3B). If the distance between the transport apparatus reference point RRBT and the station reference point RSTN is smaller than a predetermined distance or accuracy $\epsilon$ (Block 360, FIG. 3B) the position of the transport apparatus in the robot coordinate system is assigned to the station ST1 and used for subsequent pick-place operations (Block 370, FIG. 3B). If the distance between the transport apparatus reference point RRBT and the station reference point RSTN is larger than a predetermined distance or accuracy $\epsilon$ (Block 360, FIG. 3B) blocks 340 and 350 are repeated (incremental moves are made using for example points 502R-509R, 502G-509G) until the distance between the transport apparatus and station reference points RRBT, RSTN in the global coordinate system is smaller than the predetermined accuracy $\epsilon$.

For exemplary purposes only, the automatic station teaching method described above with respect to FIGS. 3A and 3B is expressed below in two degrees of freedom. However, it should be realized that the below equations may be adapted to any suitable number of degrees of freedom.

In this particular example, the inaccuracy of the robot position feedback devices and tolerances of mechanical components introduce distortion in the form of an offset, rotation, scaling factor and nonlinear error between the robot and global coordinate systems:

$$x_{SPS} = x_o + k_x \cos(\theta) x_{RBT} - k_y \sin(\theta) y_{RBT} + x_e \sin(\pi y_{RBT}) \quad [1]$$

$$y_{SPS} = y_o + k_x \sin(\theta) x_{RBT} - k_y \cos(\theta) y_{RBT} + y_e \sin(\pi x_{RBT}) \quad [2]$$

where $x_{SPS}$ and $y_{SPS}$ denote x and y coordinates of RRBT obtained from the spatial positioning system (i.e. position in the global coordinate system), and $x_{RBT}$ and $y_{RBT}$ stand for x and y coordinates of RRBT measured through the robot position feedback devices (i.e. position in the robot coordinate system). For exemplary purposes only, the approximate values for constants used in Equations [1] and [2] are defined as shown in Table 1. In alternate embodiments, it should be realized that any suitable values may be used for the constants of equations [1] and [2].

TABLE 1

| Symbol | Description | Approximate Value | Unit |
| --- | --- | --- | --- |
| θ | Rotation | −5.00 | deg |
| $x_o$ | x-offset | 0.10 | m |
| $y_o$ | y-offset | 0.05 | m |
| $k_x$ | x-axis scaling factor | 0.95 | — |
| $k_y$ | y-axis scaling factor | 1.05 | — |
| $x_e$ | Amplitude of error for x-axis | 0.10 | m |
| $y_e$ | Amplitude of error for y-axis | 0.10 | m |

Examples of the resulting position distortion in the x and y directions are shown in FIGS. 4A and 4B, respectively. It should be noted that the amount of position distortion shown in this example substantially exceeds the levels expected in typical robotic applications. This amplification of the position distortion was selected for exemplary purposes only to demonstrate the robustness of the above described method against errors in the measurements obtained through the robot position feedback devices.

Figure 6:
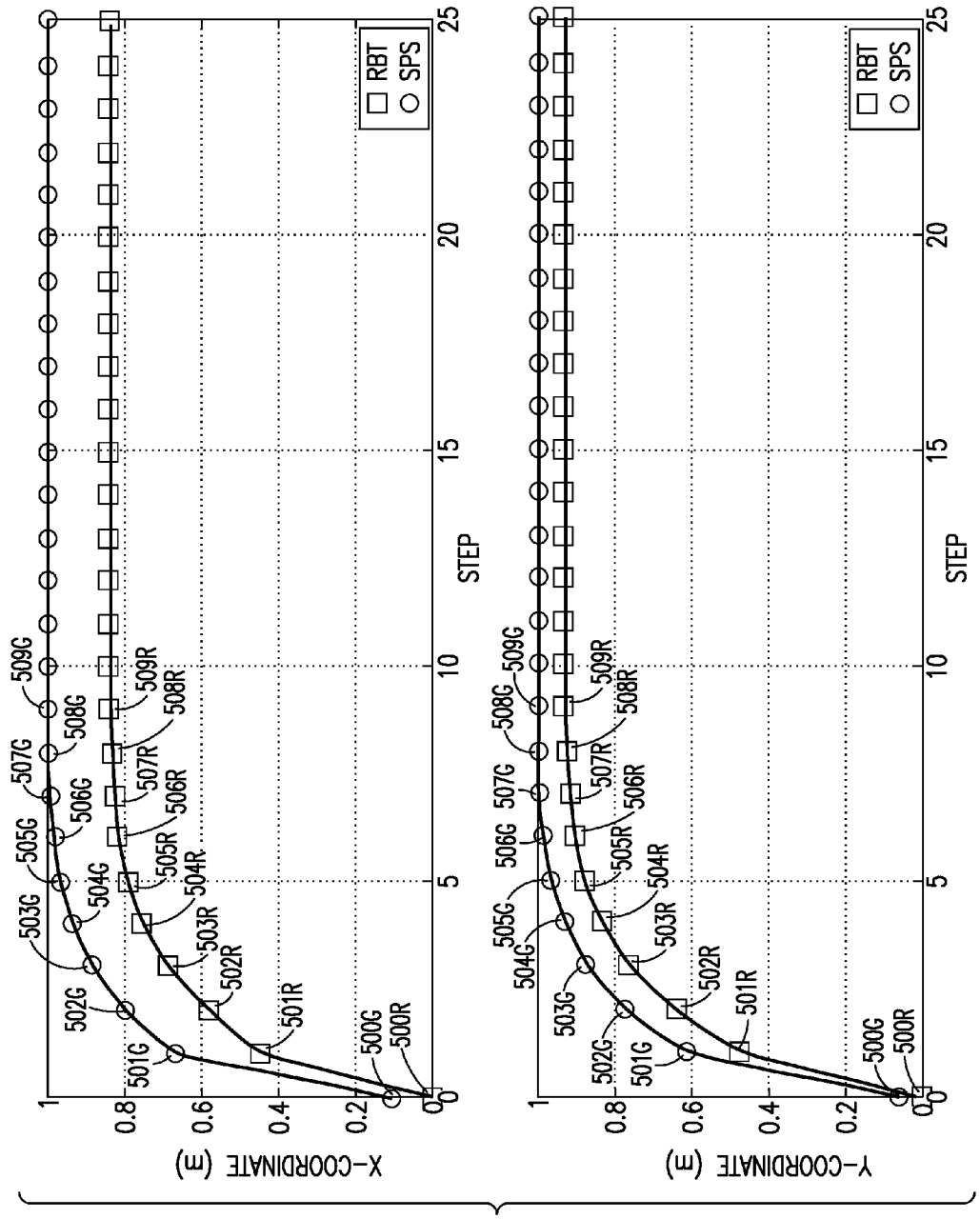
FIG. 6 illustrates a graph showing an exemplary convergence of an auto-teach process in accordance with an exemplary embodiment.

The incremental motion of the robot according to blocks 320 to 350 may be calculated based on the following exemplary expressions:

$$d_{SPS}^k = \sqrt{(x_{STN\ SPS} - x_{SPS}^{k-1})^2 + (y_{STN\ SPS} - y_{SPS}^{k-1})^2} \quad [3]$$

$$\alpha_{SPS}^k = \mathrm{atan2}(y_{STN\ SPS} - y_{SPS}^{k-1}, x_{STN\ SPS} - x_{SPS}^{k-1}) \quad [4]$$

$$d_{RBT}^k = k_d^{k-1} d_{SPS}^k \quad [5]$$

$$\alpha_{RBT}^k = \Delta_\alpha^{k-1} + \alpha_{SPS}^k \quad [6]$$

$$x_{RBT}^k = x_{RBT}^{k-1} + K d_{RBT}^k \cos(\alpha_{RBT}^k) \quad [7]$$

$$y_{RBT}^k = y_{RBT}^{k-1} + K d_{RBT}^k \sin(\alpha_{RBT}^k) \quad [8]$$

$$k_d^{k-1} = \sqrt{\frac{[(x_{RBT}^k - x_{RBT}^{k-1})^2 + (y_{RBT}^k - y_{RBT}^{k-1})^2]}{[(x_{SPS}^k - x_{SPS}^{k-1})^2 + (y_{SPS}^k - y_{SPS}^{k-1})^2]}} \quad [9]$$

$$\Delta_\alpha^k = \quad [10]$$
$$\mathrm{atan2}(y_{RBT}^k - y_{RBT}^{k-1}, x_{RBT}^k - x_{RBT}^{k-1}) - \mathrm{atan2}(y_{SPS}^k - y_{SPS}^{k-1}, x_{SPS}^k - x_{SPS}^{k-1})$$

where $x_{SPS}^k$ is the x coordinate of RRBT obtained from the spatial positioning system, $y_{SPS}^k$ is the y coordinate of RRBT obtained from the spatial positioning system, k indicates step, $x_{STNSPS}$ and $y_{STNSPS}$ denote x and y coordinates of RSTN obtained from the spatial positioning system (i.e., station location in the global coordinate system), and K is a constant between about 0 and about 1 which determines the speed of convergence of the auto-teach process. In this particular example, K was set to about 0.5 for exemplary purposes only to keep the initial incremental moves relatively short so that the auto-teach process can be presented more easily in a graphical form (see FIGS. 5 and 6). As described above, if the position of the transport apparatus reference point RRBT and the station reference point RSTN do not coincide within the predetermined accuracy ε, auto-teaching of the station ST1, for example, continues until the desired accuracy ε is reached while the following condition is satisfied:

$$\sqrt{(x_{SPS}^k - x_{STNSPS})^2 + (y_{SPS}^k - y_{STNSPS})^2} > \epsilon \quad [11]$$

In this exemplary embodiment, ε was set to about 1 μm for exemplary purposes only and following initial conditions were used to start the auto-teach process:

$$k_d^0 = 1, \Delta_\alpha^0 = 0$$

$$x_{RBT}^0 = 0, y_{RBT}^0 = 0$$

However, in alternate embodiments the accuracy ε can be set to any suitable value and any suitable initial conditions can be used.

Figure 7:
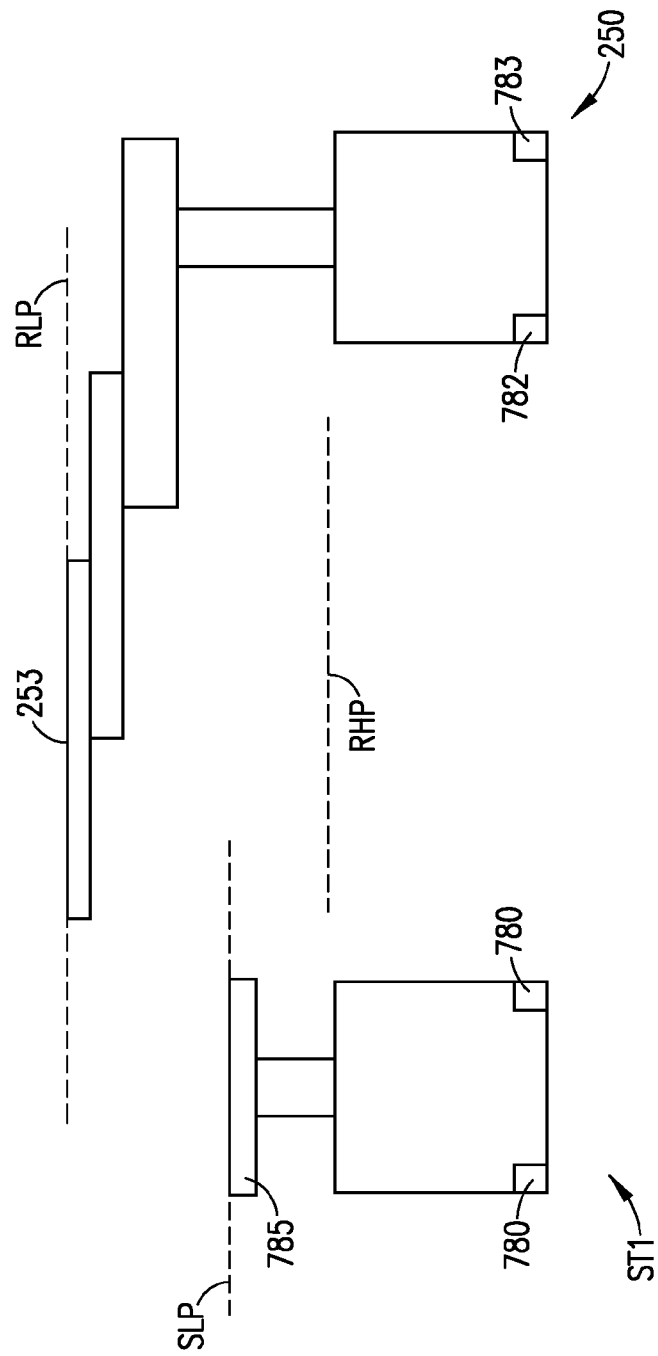
FIG. 7 is a schematic illustration of a manipulator and station in accordance with an exemplary embodiment.

In one exemplary embodiment the spatial positioning system 100 may also be configured to align the transport apparatus 250 and level a processing station such as station ST1 when, for example, the transport apparatus 250 does not have a sufficient number of axes or degrees of freedom to allow for the teaching of all the coordinates of the station. It is noted that the station ST1 generally has six degrees of freedom but in alternate embodiments the station ST1 may have any suitable number of degrees of freedom. Examples of transport apparatus that may not allow for the teaching of all six degrees of freedom of a processing station such as station ST1 include two, three and four axis robotic manipulators with planar arm mechanisms operating in parallel horizontal planes. In this example, referring also to FIG. 7, the automatic robot teaching method described above may be complemented by any suitable device 780-783 for leveling the transport end effector 253 and/or the stations ST1-ST4 and LL1, LL2 with respect to a common horizontal reference plane RHP. Although only station ST1 is shown in FIG. 7, it should be realized that stations ST2-ST4 and LL1, LL2 may be similarly configured.

The spatial positioning system 100 described herein may provide for the level check and interactive adjustment of the end effector 253 and the stations ST1-ST4 and LL1, LL2 with respect to the common horizontal reference plane RHP so that the respective reference planes SLP, RLP of the station ST1 and the transport apparatus 250 are leveled within a predetermined amount of accuracy. It is noted that the reference planes SLP, RLP, RHP shown in FIG. 7 are exemplary in nature and that the planes may be located at any suitable points with respect to one another. It is also noted that while the reference planes shown in the Figures are illustrated as being horizontal, in alternate embodiments the planes SLP, RLP, RHP may have any suitable spatial orientation. In this example, the transport apparatus reference plane RLP and station reference plane SLP respectively coincide with a plane of the end effector 253, and a plane of a substrate support 785 for exemplary purposes only.

Figure 7A:
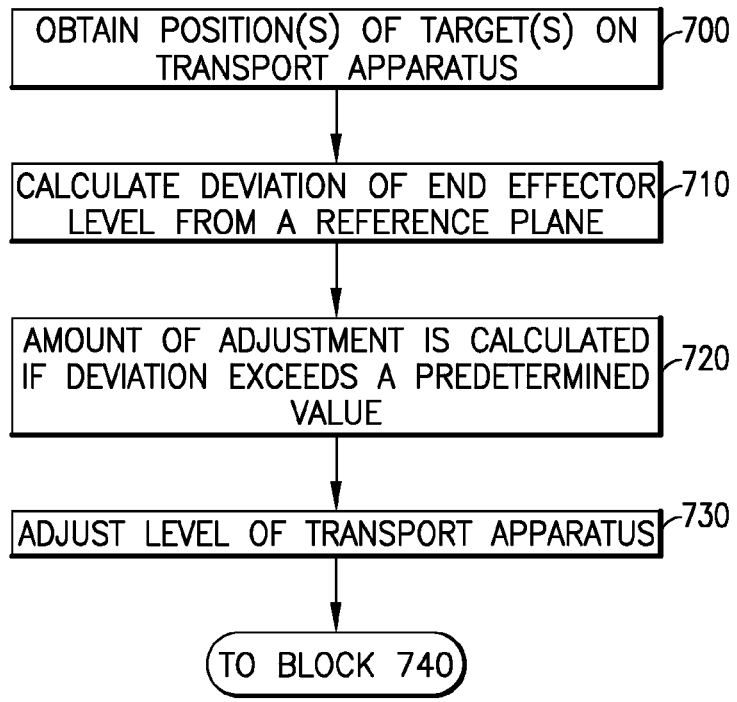
FIGS. 7A-7B illustrates a flow diagram in accordance with another aspect of an exemplary embodiment.
Figure 7B:
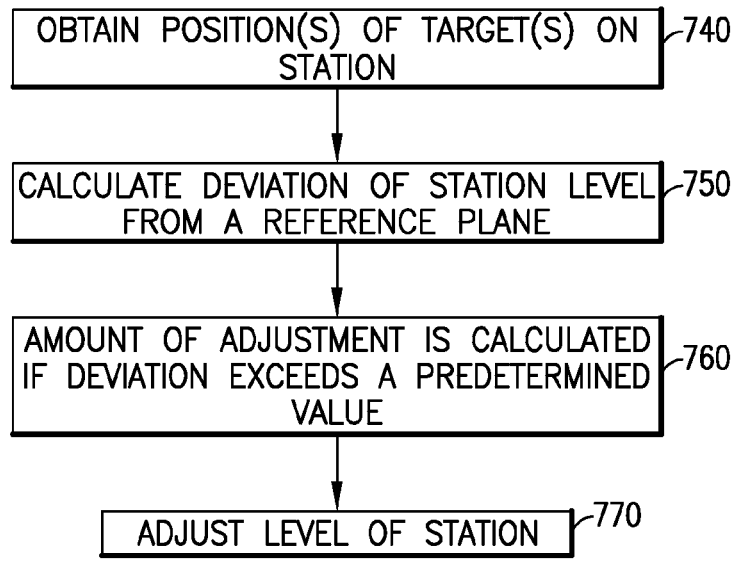

Referring also to FIGS. 2, 7A and 7B, in determining the level of the stations ST1-ST4, LL1, LL2 and end effector 253, the location of the targets 210T-210V incorporated into the end effector 253 are obtained from the spatial positioning system (Block 700, FIG. 7A). The location of the targets 210T-210V may be obtained in the global coordinate system. The controller 270 may be configured to calculate the deviation of the end effector level RLP from a reference plane such as a horizontal reference plane RHP of the processing apparatus 290 (Block 710, FIG. 7A). If the deviation between the end effector level RLP and reference plane RHP is within a predetermined amount or accuracy, no leveling adjustment of the transport apparatus 250 is made. If the deviation between the end effector level RLP and reference plane RHP is not within the predetermined amount or accuracy, leveling adjustments to the transport apparatus 250 are calculated (Block 720, FIG. 7A) and made (Block 730, FIG. 7A). In one exemplary embodiment, a coordinate system transformation may be made by, for example, the controller 270 to transform the global coordinates of the targets 210T-210V to calculate the amount of adjustment for leveling the transport apparatus 250 with respect to the reference plane RHP. In one exemplary embodiment the adjustment amounts may be presented to an operator through any suitable display connected to the controller and/or the processing apparatus 290 so that the operator can adjust the transport apparatus 250. In alternate embodiments, a level adjustment mechanism or system 782, 783 may be connected to the transport apparatus 250 for automatically adjusting the level of the transport apparatus with respect to the reference plane RHP. Blocks 700 through 730 may be repeated until the desired leveling accuracy is obtained between the end effector 253 and the reference plane RHP.

Leveling of the stations in the processing apparatus 290 with respect to the reference plane RHP may occur in a manner substantially similar to that described above with respect to the leveling of the end effector 253 (See e.g. Blocks 740-770, FIG. 7B). It is noted that while the leveling of the station ST1 is shown in FIGS. 7A, 7B as being performed after the leveling of the transport apparatus 250 for exemplary purposes only, it should be realized that the leveling of the components of the processing apparatus 290 may be performed in any suitable order or substantially simultaneously.

Figure 8:
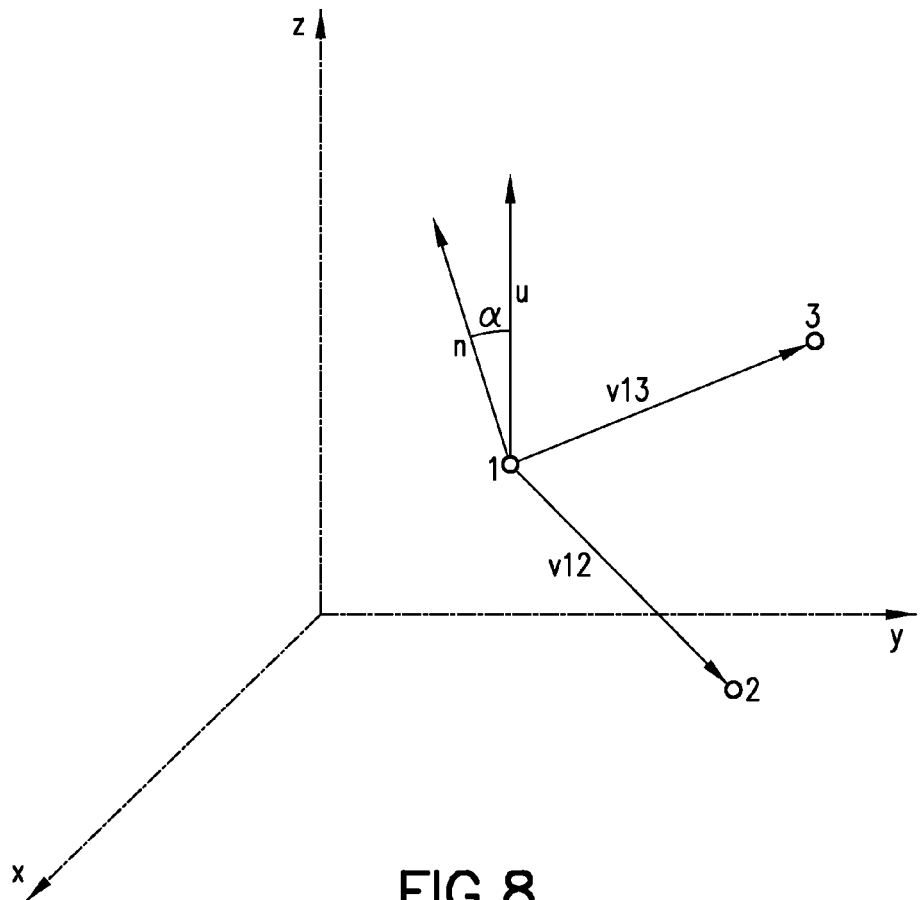
FIG. 8 illustrates a deviation from a reference plane with respect to checking level of a manipulator and/or station in accordance with an exemplary embodiment.

As an example, the algorithm for calculation of the deviation of the station ST1 or transport apparatus 250 level SLP, RLP from the reference horizontal plane RHP (Blocks 710 and 750) may utilize vectors constructed from the locations of the targets incorporated into the station ST1 or end effector 253 as shown in FIG. 8 where:

$$\vec{v}_{12} = (x_2 - x_1, y_2 - y_1, z_2 - z_1) \quad [12]$$

$$\vec{v}_{13} = (x_3 - x_1, y_3 - y_1, z_3 - z_1) \quad [13]$$

$$\vec{n} = (\vec{v}_{12} \times \vec{v}_{13}) / |\vec{v}_{12} \times \vec{v}_{13}| \quad [14]$$

$$\vec{u} = (0,0,1) \quad [15]$$

$$\alpha = a\cos(\vec{n} \cdot \vec{u}) / (|\vec{n}||\vec{u}|) = a\cos(\vec{n} \cdot \vec{u}) \quad [16]$$

and where $\vec{v}_{1i}$ denotes a vector from point 1 to point i where i=2 or 3, $\vec{n}$ is a unit vector perpendicular to the plane defined by, for example, points 1, 2 and 3, $\vec{u}$ represents a unit vector in the z-direction, and $\alpha$ is angle between vectors $\vec{n}$ and $\vec{u}$. Angle $\alpha$ may also directly define angular deviation of the plane defined by, for example, points 1, 2 and 3 from the x,y-plane which may coincide with the reference horizontal plane RHP.

In one exemplary embodiment, the amounts of adjustments determined in blocks 720 and 760 may be calculated either to, for example, match the nominal vertical location or to minimize the total amount of adjustment required.

In another exemplary embodiment, the spatial positioning system 100 may be configured to provide alignment of one or more components of, for example, the processing apparatus 290 or any other suitable components within the processing systems shown in FIGS. 1A-1C and 2 (e.g. transport apparatus, automated material handling systems, load ports, processing modules, substrate aligners, etc.) with respect to a common reference point. The common reference point may be any suitable reference point that may be located within or outside the processing apparatus 290. In this example the common reference point CRP may be in load port LL1 of FIG. 2. In one exemplary embodiment, it is noted that the common reference point CRP may be located at or associated with a central component of the system to which other components of the system may be attached. For example, referring to FIGS. 1A and 2, the central component may be the transport chamber 22 (e.g. vacuum chamber). In alternate embodiments the reference point may be located at any suitable location within the fabrication facility. The alignment of the processing system components may be performed at any suitable time, including, but not limited to, during system integration or when the processing system is serviced in the field.

Figure 9:
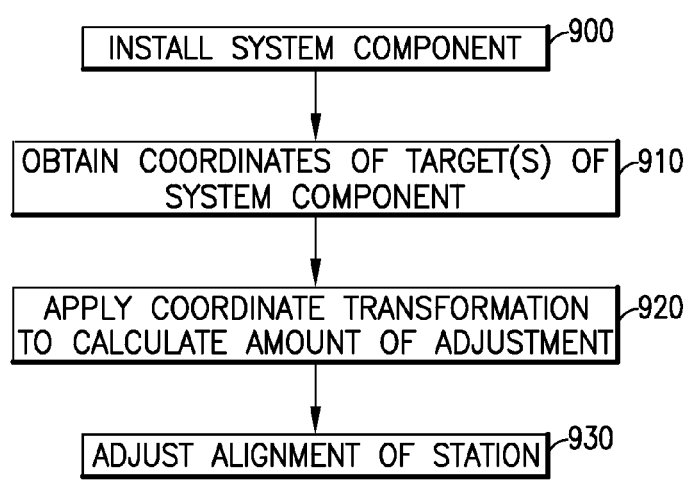
FIG. 9 illustrates a flow diagram in accordance with yet another aspect of an exemplary embodiment.

For example, referring now to FIG. 9, a component subject to integration with a system, such as a station or processing module ST1 of FIG. 2 may be installed in an initial or nominal location using default setting of mounting and adjustment features (Block 900, FIG. 9). The nominal location and default settings may be obtained in any suitable manner including, but not limited to, CAD drawings or layouts of, for example, the processing apparatus. The location of the targets, which in this example are targets 210A-210C that may be incorporated into the station ST1, are obtained from the spatial positioning system (Block 910, FIG. 9). The location of the targets 210A-210C may be obtained in the global coordinate system. As noted before, the targets 210A-210C may be in a known relationship with the station reference point RSTN such that controller 270 may be configured to calculate the deviation between the installed position of the station ST1 and the aligned position of the station ST1 with respect to the common reference point CRP. If the deviation between the installed position and the aligned position of the station ST1 is within a predetermined amount or accuracy, no positional adjustments of the station ST1 are made. If the deviation between the installed position and the aligned position of the station ST1 is not within the predetermined amount or accuracy positional adjustments to the station ST1 are made. In one exemplary embodiment, a coordinate system transformation may be made by, for example, the controller 270 to transform from the global coordinates of the targets 210A-210C to any other suitable coordinate system of the processing apparatus or fabrication facility (Block 920, FIG. 9). The controller 270 may use the transformed coordinates (or non-transformed coordinates if the coordinates obtained in block 910 are those used for calculating the adjustments) to calculate the amount of adjustment to the individual mounting and adjustment features of, for example, the station ST1 to align the station with respect to the common reference point. In one exemplary embodiment, it is noted that the coordinate transformation may convert the coordinates of the targets directly to the amounts of adjustments so that after the transformation no additional calculations should be needed. In one exemplary embodiment the adjustment amounts of each mounting and adjustment feature may be presented to an operator through any suitable display connected to the controller and/or the processing apparatus 290 so that the operator can adjust the station ST1 (Block 930, FIG. 9). In alternate embodiments, an alignment adjustment mechanism or system may be connected to the station ST1 for automatically adjusting the alignment of the transport apparatus with respect to the common reference point CRP. Blocks 910 through 930 may be repeated until the desired alignment accuracy is obtained between, for example, the station ST1 and the common reference point CRP.

As may be realized the accuracy and repeatability of a robotic system may deteriorate over time due to, for example, degradation in mechanical components or in the position measuring components of the system due to normal operational wear. In other examples, a level of accuracy and repeatability may be difficult to obtain because of high costs in obtaining accurate position feedback devices or in the difficulties of manufacturing close tolerance mechanical components. The spatial positional system 100 disclosed herein may be configured for on-the-fly correction of a position of, for example, transport apparatus 250 or any other suitable transport in the processing apparatus shown in FIGS. 1A-1C and 2. On-the-fly position correction may allow, for example, the end effector 253 of the transport apparatus 250 to be positioned within a station so the substrate or other material to be transported can be picked from or placed to the station with a predetermined accuracy regardless of position errors that may result from inaccuracy of position feedback devices and tolerances of the mechanical components of the transport apparatus 250. In alternate embodiments the spatial positioning system 100 may be configured to correct a position of any suitable apparatus in any suitable manufacturing environment.

An exemplary on-the-fly position correction will be described with respect to FIGS. 2 and 10. It is noted while the transport apparatus 250 and station ST1 are used in describing the position correction, that the position correction can be applied to any suitable transport and station. In correcting the position of, for example, the end effector 253 of the transport apparatus 250 during, for example, a pick or place operation the transport apparatus is commanded by e.g. controller 270 to move the end effector 253 to a station ST1 where the pick or place operation is to be performed (Block 1000, FIG. 10). In one exemplary embodiment the reference point of the end effector RRBT may be moved so that its position coincides or is substantially aligned, for example, over the station reference point RSTN. It is noted that the station reference point RSTN was taught in the robot coordinate system as described above with respect to FIGS. 3A and 3B. In alternate embodiments the transport reference point RRBT may be moved to any suitable location.

Figure 10:
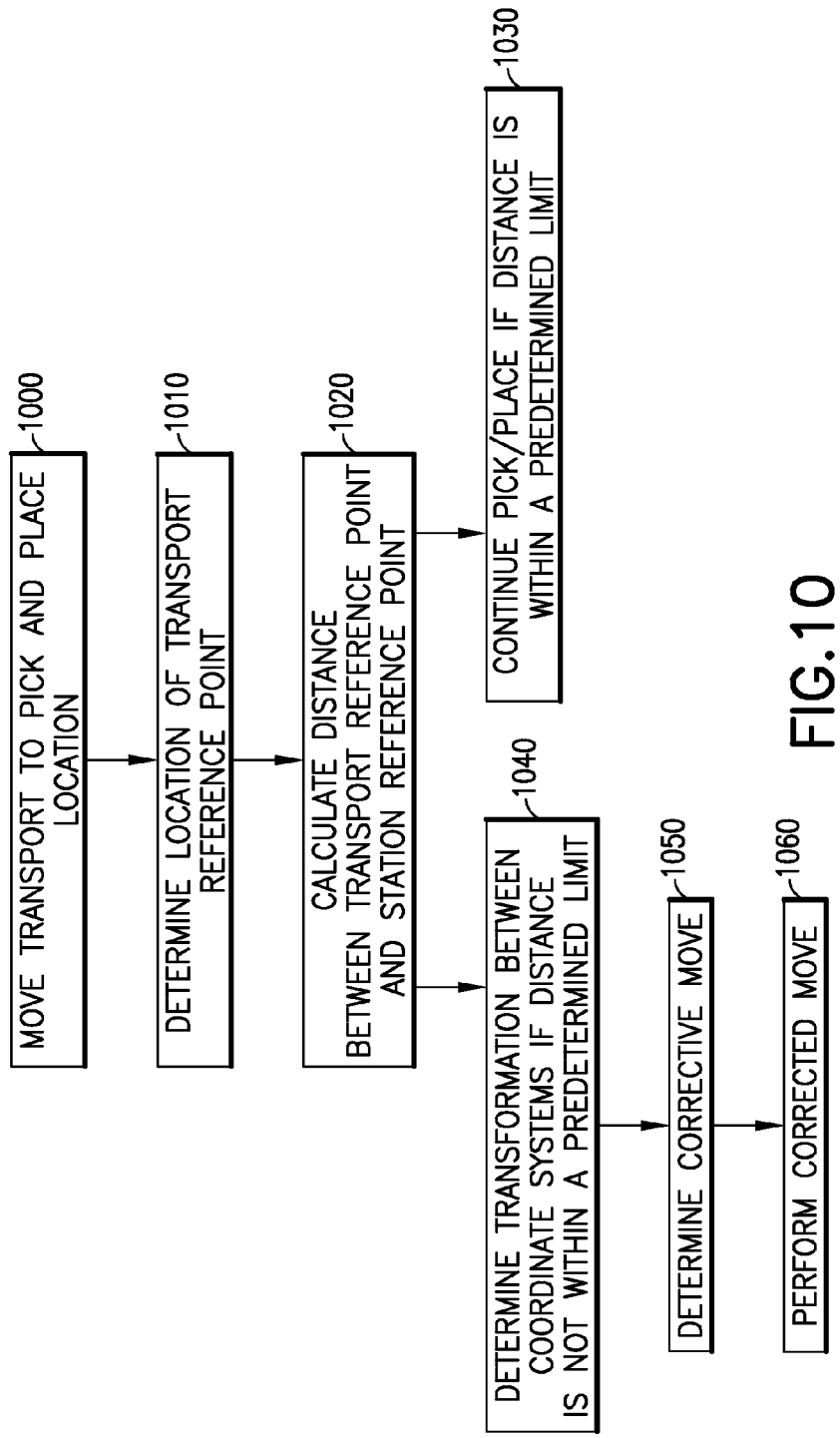
FIG. 10 illustrates a flow diagram in accordance with still another aspect of an exemplary embodiment.

The location of the targets 210T-210V and the reference point RRBT of the end effector 253 are determined by the spatial coordinate system using any suitable transmitter such as, for example, transmitters 200A, 200B (Block 1010, FIG. 10). The location of the targets 210T-210V and the reference point RRBT may be determined in, for example, the global coordinate system. In alternate embodiments the location of the targets 210T-210V and the reference point RRBT may be determined in any suitable coordinate system. In this exemplary embodiment, the global coordinates of the transport reference point RRBT may be compared with the global coordinates of the station reference point RSTN and a distance between the two may be calculated (Block 1020, FIG. 10). If the calculated distance between the station reference point RSTN and the transport reference point RRBT is within a predetermined distance (e.g. accuracy value) the pick or place operation continues (Block 1030, FIG. 10). If the calculated distance between the station reference point RSTN and the transport reference point RRBT is not within the predetermined distance or accuracy value the start point and end point (in the global and robot coordinate systems) of the move made in block 1000 above is used to determine a transformation between the robot and global coordinate systems in the vicinity of the current position of the end effector 253 (Block 1040, FIG. 10). In this example, the start point of the move in block 1000 may be the retracted position of the transport apparatus 250 shown in FIG. 2 and the end point may be an extended position of the transport apparatus where the end effector 253 is located in proximity to, for example, the station ST1. In alternate embodiments any suitable start and end points may be used as the start and end points of the move in block 1000. The coordinate transformation from block 1040 and the station reference point RSTN in, for example, the global coordinate system, relative to a current location of the transport reference point RRBT are used to determine a corrective move for the end effector 253 in the robot coordinate system (Block 1050, FIG. 10). The corrective move may include a direction and distance to place the transport apparatus reference point RRBT in a more accurate position with respect to the station reference point RSTN. The transport apparatus 250 is commanded to perform the corrective move toward the station reference point RSTN (Block 1060, FIG. 10). Blocks 1020-1060 may be repeated until the position of the transport apparatus reference point RRBT is located within the predetermined distance or accuracy relative to the station reference point RSTN. It should be realized that the difference calculated in block 1020 can be monitored and recorded in a memory 275 for each pick or place operation performed by the transport apparatus 250. In alternate embodiments, the difference calculated in block 1020 may be periodically monitored and recorded at any suitable intervals. This recorded distance information may be used for any suitable purpose including, but not limited to, health monitoring, fault diagnostic purposes and/or preventative maintenance of the processing system.

As noted above the spatial positioning system 100 may be configured as a position feedback device for positional control and/or commutation of, for example drive systems. The drive systems may include any suitable drive systems having any suitable number of degrees of freedom (e.g. single or multi dimensional actuators) such as, for example, rotary drive systems, planar or linear drive systems, spherical drive systems or a combination thereof. The drive systems may be bearing drives, self-bearing drives (e.g. magnetically levitated platforms or shafts) or any other suitable drive.

Figure 11:
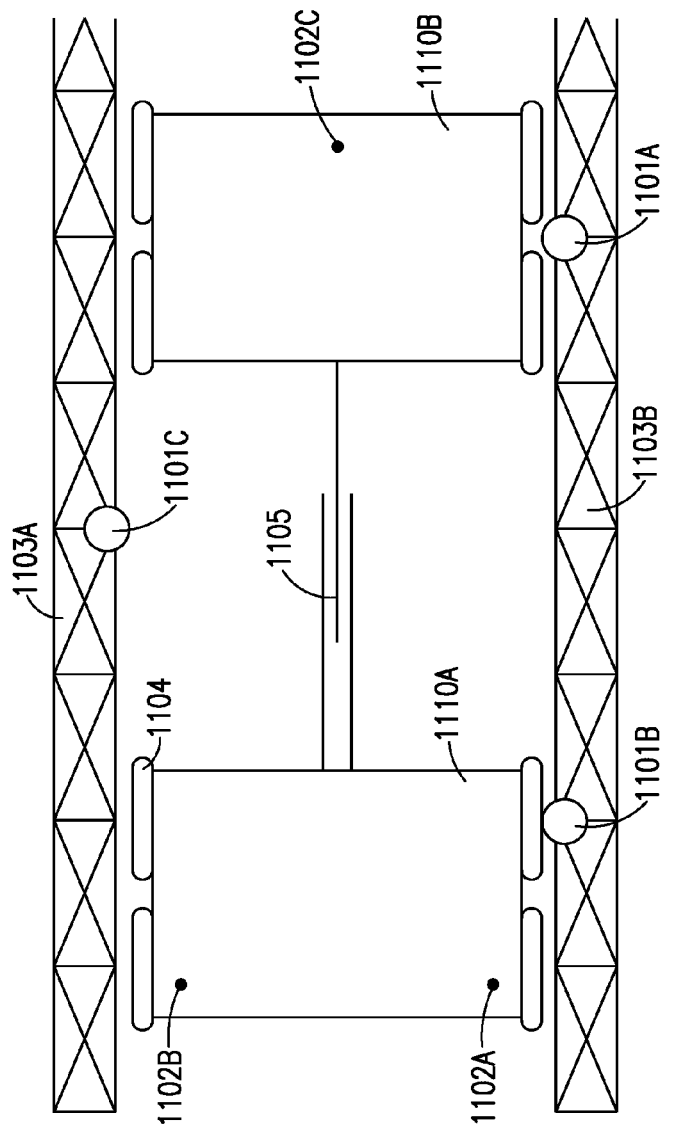
FIGS. 11 and 12 illustrate schematic diagrams of exemplary actuators in accordance with aspects of the exemplary embodiments.
Figure 12:
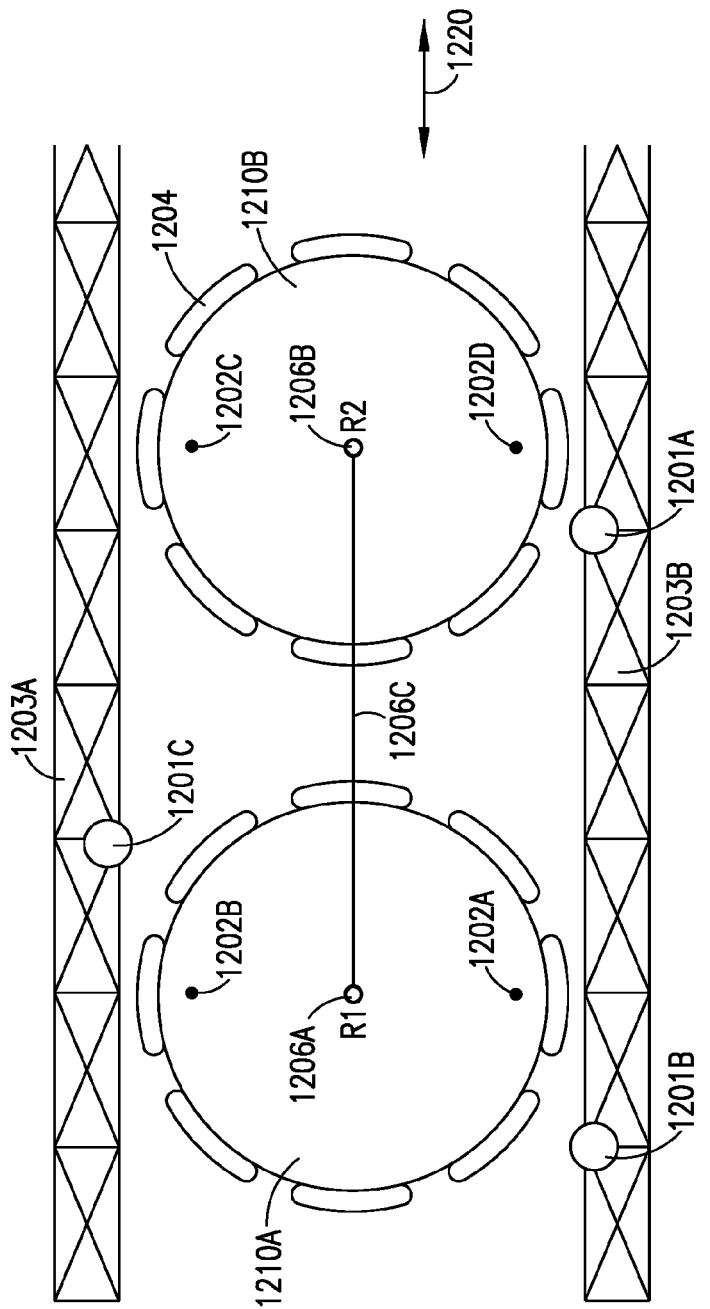

Referring now to FIGS. 11 and 12 exemplary material handling drive systems are shown in accordance with an exemplary embodiment. It should be realized that while material handling drive systems are shown in the Figures that the exemplary embodiments are equally applicable for feedback position and commutation of any suitable drive systems.

FIG. 11 illustrates a seven degree of freedom planar drive system 1100 including, for example, two magnetically levitated platforms 1110A, 1110B coupled together through for example, a prismatic coupling 1105. In alternate embodiments the planar drive system 1100 may have any suitable number of degrees of freedom and any suitable number of platforms coupled together by any suitable couplings. The platforms 1110A, 1110B may include any suitable magnets 1104 for interacting with windings 1103A, 1103B. Suitable magnet/winding pairs are described in, for example, U.S. patent application Ser. No. 11/769,651, filed on Jun. 27, 2007, the disclosure of which is incorporated by reference herein in its entirety. In this exemplary embodiment, stationary SPS units 1101A-1101C are incorporated or embedded into the windings 1103A, 1103B. In alternate embodiments the stationary SPS units may be located in any suitable location of the drive system including, but not limited to, drive housings or frames. The stationary SPS units 1101A-1101C may be substantially similar to the transmitters/transceivers 200A-200F described above with respect to FIG. 2. Movable SPS units 1102A-1102C are incorporated or embedded into the platforms 1110A, 1110B and may be substantially similar to the passive/active targets 210A-210N, 210P-210V described above with respect to FIG. 2. In alternate embodiments, the moveable SPS units may be located at any suitable location of the movable drive member such as platforms 1110A, 1110B. In still other alternate embodiments the stationary and moveable SPS units may not be embedded in their respective windings and platforms. For example, in alternate embodiments the stationary and moveable SPS units may be removably (or non-removably) fixed in or on the windings or platforms. It is noted that while three stationary and three movable SPS units are shown in FIG. 11 for exemplary purposes only, in alternate embodiments any suitable number of movable and stationary SPS units may be incorporated into the drive system 1100. Again, it is also noted that the placement of the stationary and movable SPS units shown in FIG. 11 is exemplary only and that the stationary and movable SPS units may be located in any suitable locations within the drive 1100.

Referring to FIG. 12, an exemplary eight degree of freedom drive system 1200 is shown in accordance with an exemplary embodiment. In this example, the drive system 1200 includes two magnetically levitated platforms 1210A, 1210B having magnets 1204 attached thereto, windings 1203A, 1203B, stationary SPS units 1201A-1201C and movable SPS units 1202A-1202D. The magnets 1204, windings 1203A, 1203B, stationary SPS units 1201A-1201C and movable SPS units 1202A-1202D may be substantially similar to those described above with respect to FIG. 11. The platforms 1210A, 1210B may be coupled by a rotatable couplings 1206A, 1206B and connecting member 1206C such that the platforms can move in at least the direction of arrow 1220 and rotate about a respective axis of rotation R1, R2.

Figure 13:
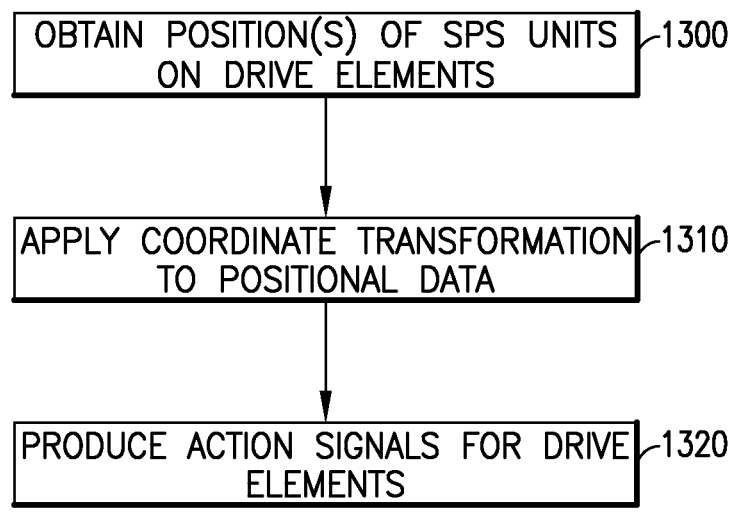
FIG. 13 illustrates a flow diagram in accordance with an aspect of an exemplary embodiment.

Referring now to FIG. 13 the position control and commutation of the drive system 1100 of FIG. 11 will be described. It is noted that the position control and commutation of the drive system 1200 in FIG. 12 may be performed in a substantially similar manner to that described for drive system 1100. As may also be realized the position control and commutation of any suitable drive system using the spatial positioning system 100 may be substantially similar to that described below. For position control and commutation, the locations of the movable SPS units 1102A-1102C of the actuator element subject to commutation and control are obtained in a manner substantially similar to that described above with respect to FIG. 2 (Block 1300, FIG. 13). In this example the actuator element subject to commutation and control may be platform 1110A and/or platform 1110B. In this exemplary embodiment the locations of the movable SPS units 1102A-1102C may be obtained, for example, periodically such as at the frequency of the control loop. In alternate embodiments, the locations of the movable SPS units 1102A-1102B may be obtained at any suitable time intervals. The locations of the movable SPS units 1102A-1102B may be stored in, for example memory 275 to form location data sets corresponding to, for example, the periods of the control loop. In alternate embodiments the location data sets may be stored in any suitable manner. In this exemplary embodiment, a coordinate transformation is applied to, for example, the data set(s) to transform global coordinates of the movable SPS units 1102A-1102C any suitable coordinate system (Block 1310, FIG. 13). For exemplary purposes only, the coordinate transformation may provide generalized coordinates associated (or collocated) with the generalized forces acting on the actuator elements (e.g. the moving components of the actuators). In alternate embodiments, the position control and commutation may be performed in the global coordinate system. Here the coordinate transformation is applied in each period of the control loop but in alternate embodiments the coordinate transformation may be applied at any suitable times. The transformed coordinates of the movable SPS units 1102A-1102C are used to determine the position information for commutation and control of the drive system 1100. In one exemplary embodiment the positions or locations of the movable SPS units 1102A-1102C may be transformed to quantities (e.g. coordinates) collocated (or associated) with, for example, generalized forces acting on the moving components of the drive system 1100. In alternate embodiments the positions or locations of the movable SPS units 1102A-1102C may be transformed to any quantities (e.g. coordinates) suitable for commutating and controlling the drive system 1100. The positional information described above with respect to block 1310 may be input into any suitable commutation algorithm and position control loop to produce action signals including, but not limited to, voltage and/or current for controlling the drive system 1100 (Block 1320, FIG. 13). Examples of suitable commutation algorithms can be found in U.S. patent application Ser. No. 11/769,651 described above and U.S. patent application Ser. No. 11/769,688, filed on Jun. 27, 2007, the disclosure of which is incorporated by reference herein in its entirety. In one exemplary embodiment, the SPS 100 may be configured to calibrate a robotic manipulator (e.g. substantially similar to the transport apparatus described above) to map, for example, the actual positions of the manipulator end effector obtained from the SPS 100 against positions of the end effector calculated based on encoder readings (from motors used for moving the end effector), and storing the map in a controller of the robotic manipulator. The map may substantially eliminate inaccuracy of the robotic manipulator. The map may also substantially eliminate teaching every processing station location to the manipulator since the manipulator can be commanded to go accurately to the station positions obtained using the SPS targets 210A-210N, 210P-210V located in the stations. It is noted that a couple of positions of the end effector may have to be checked against measurements of the SPS 100 to identify a coordinate transformation that would reflect the location of the robotic manipulator with respect to a coordinate frame of the SPS 100.

In another exemplary embodiment, the targets 210A-210N, 210P-210V of the SPS may be embedded to, for example, the material (e.g. semiconductor wafers) being handled or processed in, for example, a processing apparatus 10. In this example, the SPS 100 may be configured to substantially continuously track the position of the material in the processing apparatus 10 and share the information with for example, the transport system 23. This may allow the transport apparatus of the transport system 23 to pick the material so that it is accurately positioned (e.g. centered in the case of circular substrates) on an end effector of the transport apparatus. In one example, where the material could not be picked so that it is centered on the end effector or if the material slips on the end effector during, for example, transportation, the transport apparatus could correct the misalignment when placing the material. In this example, the SPS 100 may substantially eliminate a need for a substrate centering device, such as an aligner, or an active substrate centering system.

In yet another exemplary embodiment, the SPS 100 described herein may be extended to systems, such as material handling systems with stations that are not stationary, such as in the case of a conveyor type system. In this example, the moving stations and an end effector of a robotic manipulator include targets substantially similar to targets 210A-210N, 210P-210V, as described herein, and/or targets are embedded in the material being moved throughout the system, as described above. The robotic manipulator may be configured to utilize information from the SPS 100 to match, for example, a direction and speed of motion with the moving station to pick or place material from/to the station.

The exemplary embodiments described herein may be utilized individually or in any combination thereof for automatically teaching, aligning and/or controlling elements of any suitable robotic system. It should be understood that the foregoing description is only illustrative of the embodiments. Various alternatives and modifications can be devised by those skilled in the art without departing from the embodiments. Accordingly, the present embodiments are intended to embrace all such alternatives, modifications and variances that fall within the scope of the appended claims.

What is claimed is:

1. A substrate processing system comprising:
a housing comprising a first housing module configured to hold an isolated atmosphere therein and closable openings configured for communicably connecting the first housing module to a second housing module having a substrate holding station and a substrate holding station reference point associated therewith;
a transport apparatus partly within the first housing module and configured to transport a substrate;
at least one target;
at least one transmitter configured to transmit an identification signal to the at least one target; and
a controller operably connected to the transport apparatus, the at least one target and the at least one transmitter, the controller being configured to receive data signals, based on the identification signal, from one of the at least one target and the at least one transmitter and effect transfer of the substrate with the transport apparatus from the first housing module to the substrate holding station of the second housing module through the closeable opening, based on the data signals.

2. The system of claim 1, wherein the controller is further configured to:
determine a location of the at least one target relative to the at least one transmitter based on the identification signal, the identification signal uniquely identifying each of the at least one transmitter; and
determine a position of the transport apparatus from the identification signals transmitted by the at least one transmitter to at least one target.

3. The system of claim 1, wherein, the transport apparatus is controlled based on a relationship between the substrate holding station reference point and a position of the transport apparatus.

4. The system of claim 3, wherein:
the controller is further configured to,
determine a position of a leveling plane of the transport apparatus;
determine a deviation between the position of a reference plane associated with the substrate processing system and the position of the leveling plane; and
effect an adjustment of the leveling plane if the deviation exceeds a predetermined limit.

5. The system of claim 3, further comprising:
a common reference feature of the substrate processing system;
the controller is further configured to,
determine the position of the transport apparatus relative to the common reference feature;
determine amounts of adjustment for the transport apparatus; and
effect an adjustment of the position of the transport apparatus so that the position of the transport apparatus is within a predetermined distance relative to the common reference feature.

6. The system of claim 1, wherein the at least one target is affixed to the transport apparatus and the at least one transmitter is connected to the housing.

7. The system of claim 6, wherein:
the controller is further configured to,
command movements of the transport apparatus depending on a relative position between the at least one target and the substrate holding station reference point so that the position of the at least one target is within a predetermined distance of the substrate holding station reference point;
wherein when the at least one target is within the predetermined distance, the controller is configured to assign a location of the transport apparatus to the substrate holding station reference point for pick and place operations.

8. The system of claim 6, further comprising:
a station module connected to the housing, the station module having a second processing device reference point;
wherein,
the transport apparatus is a robotic manipulator;
the operational characteristic is a transport apparatus reference point, where the transport apparatus reference point is located on an end effector of the robotic manipulator; and
wherein during a pick or place operation the controller is further configured to,
effect movement of the transport apparatus so the at least one target is moved to a location of second substrate holding station reference point reference point;
determine a difference between a location of the at least one target and the second substrate holding station reference point; and
if the difference exceeds a predetermined distance, effect a corrective movement of the transport apparatus so the location of the at least one target is within the predetermined distance.

9. The system of claim 6, wherein the at least one transmitter is located in the second housing module.

10. The system of claim 1, wherein the at least one transmitter is affixed to the transport apparatus and the at least one target is connected to the housing.

11. The system of claim 10, wherein the at least one target is located in one or more of the first housing module and the second housing module.

12. A substrate processing system comprising:
a housing comprising a first housing module configured to hold an isolated atmosphere therein and closable openings configured for communicably connecting the first housing module to a second housing module;

a transport apparatus partly within the first housing module and configured to transport a substrate between the first and second housing modules;

at least one target distinct from the substrate;

at least one transmitter configured to detect the at least one target; and a controller operably connected to the transport apparatus and the at least one transmitter, the controller being configured to receive detection signals from at least the at least one transmitter and to effect transfer of the substrate with the transport apparatus from the first housing module to a substrate holding station of the second housing module through the closeable opening, based on the detection signals, where the detection signals include a position of the at least one target detected by the at least one transmitter.

13. The substrate processing system of claim 12, wherein the at least one transmitter is affixed to the transport apparatus and the at least one target is connected to the housing.

14. The substrate processing system of claim 12, wherein the transport apparatus includes a transport apparatus reference point and the substrate holding station includes a substrate holding station reference point, the transport apparatus being controlled by the controller based on a relationship between the substrate holding station reference point and the transport apparatus reference point.

15. The substrate processing apparatus of claim 12, wherein the controller is operably connected to the at least one target and configured to receive the detection signals from the at least one target.

16. The substrate processing system of claim 12, wherein the at least one target is affixed to the transport apparatus and the at least one transmitter is connected to the housing.

17. The substrate processing system of claim 16, wherein the at least one transmitter is located in the second housing module.

18. The substrate processing system of claim 12, wherein the at least one target is located in one or more of the first housing module and the second housing module.

19. A substrate processing system comprising:

a housing comprising a first housing module configured to hold an isolated atmosphere therein and closable openings configured for communicably connecting the first housing module to a second housing module having a substrate holding station;

a transport apparatus partly within the first housing module and configured to transport a substrate;

at least one target affixed to one of the transport apparatus and the housing;

at least one transmitter connected to another one of the transport apparatus and the housing, the at least one transmitter being configured to transmit an identification signal to the at least one target; and a controller operably connected to the transport apparatus, and the at least one transmitter, the controller being configured to receive data signals, based on the identification signal, from at least the at least one transmitter and effect transfer of the substrate with the transport apparatus from the first housing module to the substrate holding station of the second housing module through the closeable opening, based on the data signals.

20. The substrate processing apparatus of claim 19, wherein the controller is operably connected to the at least one target and configured to receive the data signals from the at least one target.

* * * * *